United States Patent [19]

Inoue

[11] Patent Number: 5,508,216
[45] Date of Patent: Apr. 16, 1996

[54] THIN FILM TRANSISTOR, SOLID DEVICE, DISPLAY DEVICE AND MANUFACTURING METHOD OF A THIN FILM TRANSISTOR

[75] Inventor: Satoshi Inoue, Suwa, Japan

[73] Assignee: Seiko Epson Corporation, Tokyo, Japan

[21] Appl. No.: 199,185

[22] PCT Filed: Jun. 23, 1993

[86] PCT No.: PCT/JP93/00849

§ 371 Date: Apr. 28, 1994

§ 102(e) Date: Apr. 28, 1994

[87] PCT Pub. No.: WO94/00882

PCT Pub. Date: Jan. 6, 1994

[30] Foreign Application Priority Data

Jun. 24, 1992 [JP] Japan ...................... 4-166021
Nov. 25, 1992 [JP] Japan ...................... 4-315331
Dec. 4, 1992 [JP] Japan ...................... 4-325315

[51] Int. Cl.⁶ .................... H01L 27/01; H01L 29/04; H01L 29/784
[52] U.S. Cl. .................... 437/40; 437/48; 437/59; 437/907; 257/66; 257/344
[58] Field of Search .................... 257/351, 347, 257/352, 408, 66, 344; 437/16, 21, 29, 36, 40, 44, 48, 983, 59, 907, 978

[56] References Cited

U.S. PATENT DOCUMENTS 5,266,504  11/1993  Blouse et al. .................... 437/31
5,308,998   5/1994  Yamazaki et al. ................ 257/57
5,323,042   6/1994  Matsumoto ....................... 257/350

FOREIGN PATENT DOCUMENTS

| 58-142566 | 8/1983 | Japan | 257/347 |
| 58-206121 | 12/1983 | Japan | 257/347 |
| 60-47467 | 3/1985 | Japan | 257/347 |
| 61-85868 | 5/1986 | Japan | 257/213 |
| 61-104671 | 5/1986 | Japan | 257/347 |
| 61-170724 | 8/1986 | Japan | 257/213 |
| 2-246277 | 10/1990 | Japan | 257/347 |
| 3-79081 | 4/1991 | Japan | 257/66 |
| 4-115230 | 4/1992 | Japan | 257/347 |

*Primary Examiner*—Donald L. Monin, Jr.
*Attorney, Agent, or Firm*—Harold T. Tsiang

[57] ABSTRACT

A thin film transistor which has improved electric characteristics such as off current characteristics, and a manufacturing method of a thin film transistor. A thin film transistor has an n– source area and an n– drain area comprising an n– silicon film (low concentration area). The n– silicon film is made by performing a crystallization treatment such as an SPC method on an amorphous silicon. The crystallization treatment is carried out after the implantation of impurities but before a gate electrode is formed and activates the impurities at the same time. Accordingly, the activation of impurities is not restricted by the heat resistance of the materials for the gate electrode. A gate electrode made of metal is formed after the n– source area and n– drain area are formed. The gate electrode, n– source area and n– drain area are not formed by self-alignment.

20 Claims, 16 Drawing Sheets

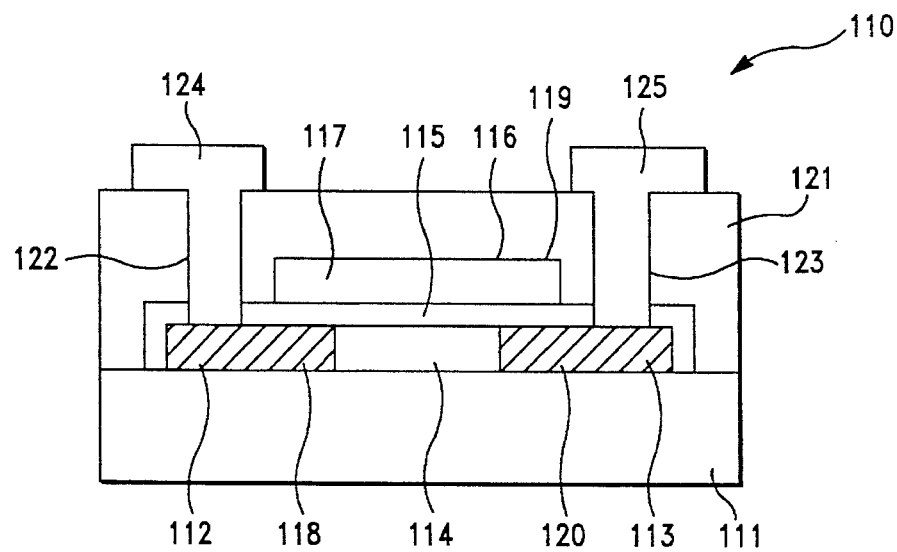
FIG.–1
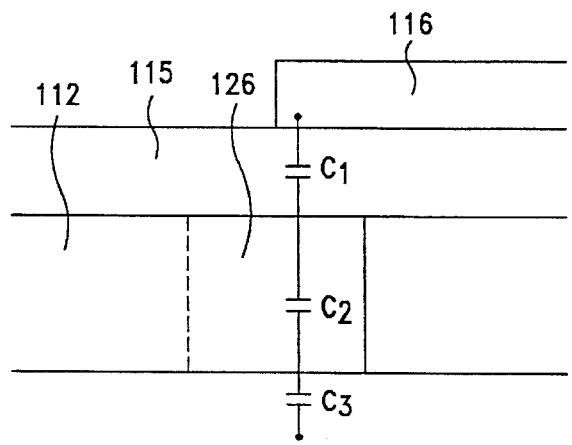
FIG.–3A
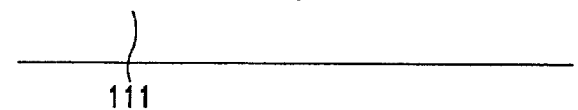
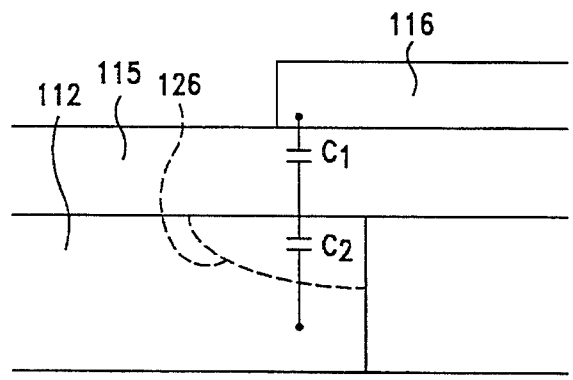
FIG.–3B
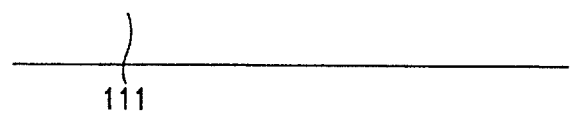

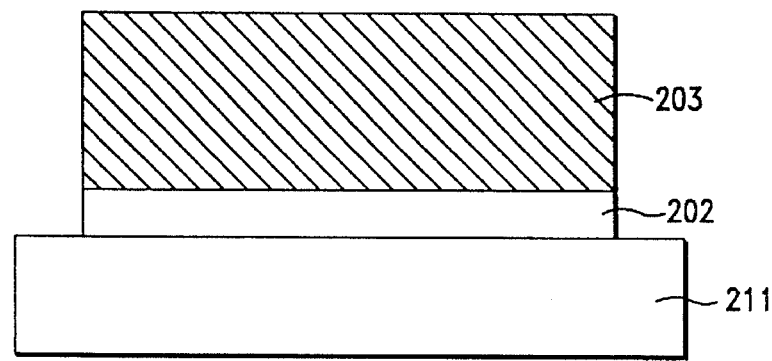
FIG.—4A
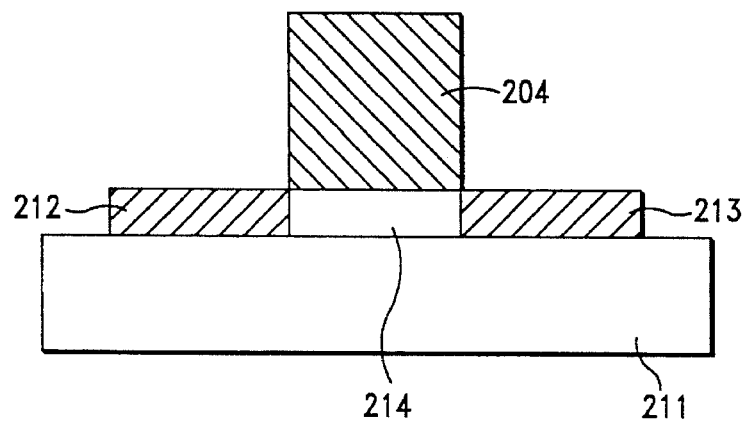
FIG.—4B
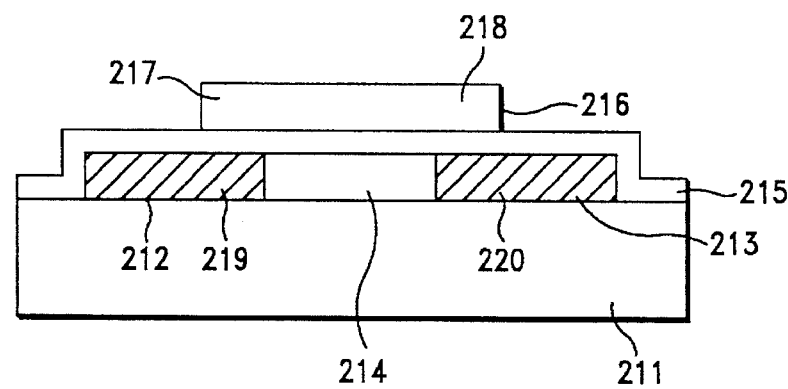
FIG.—4C
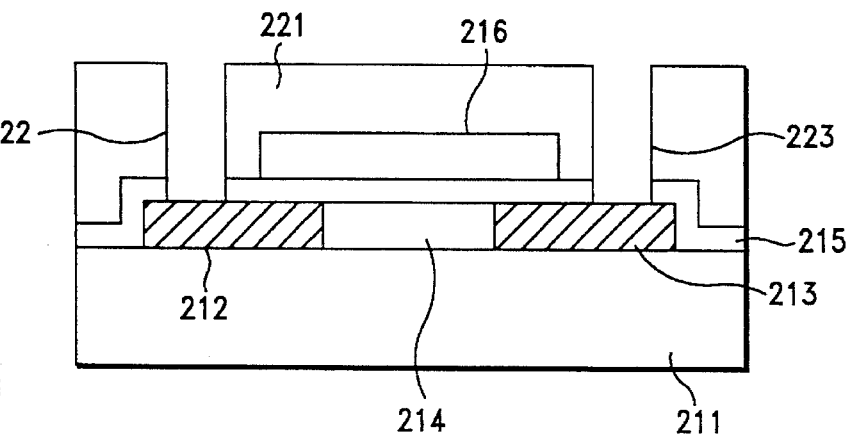
FIG.—4D

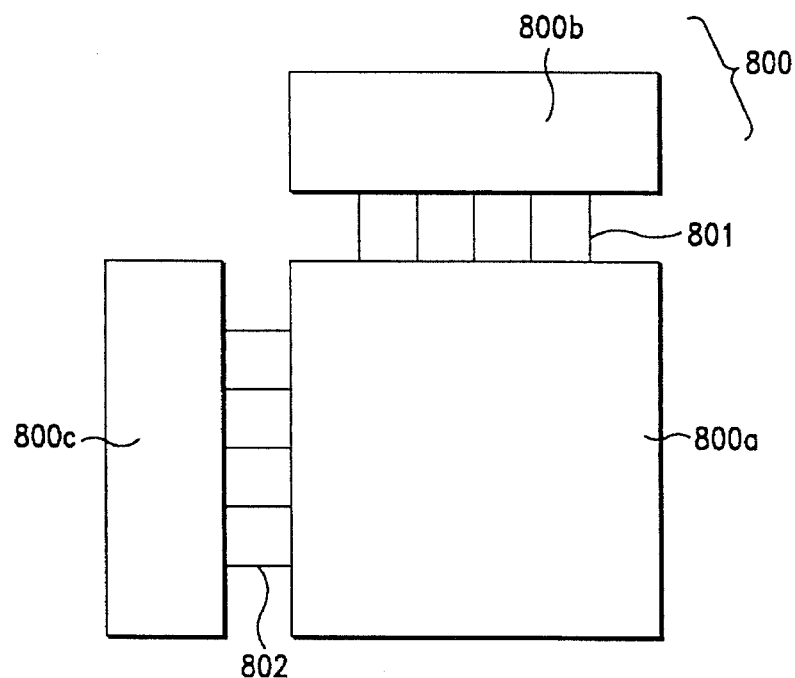
FIG.—12
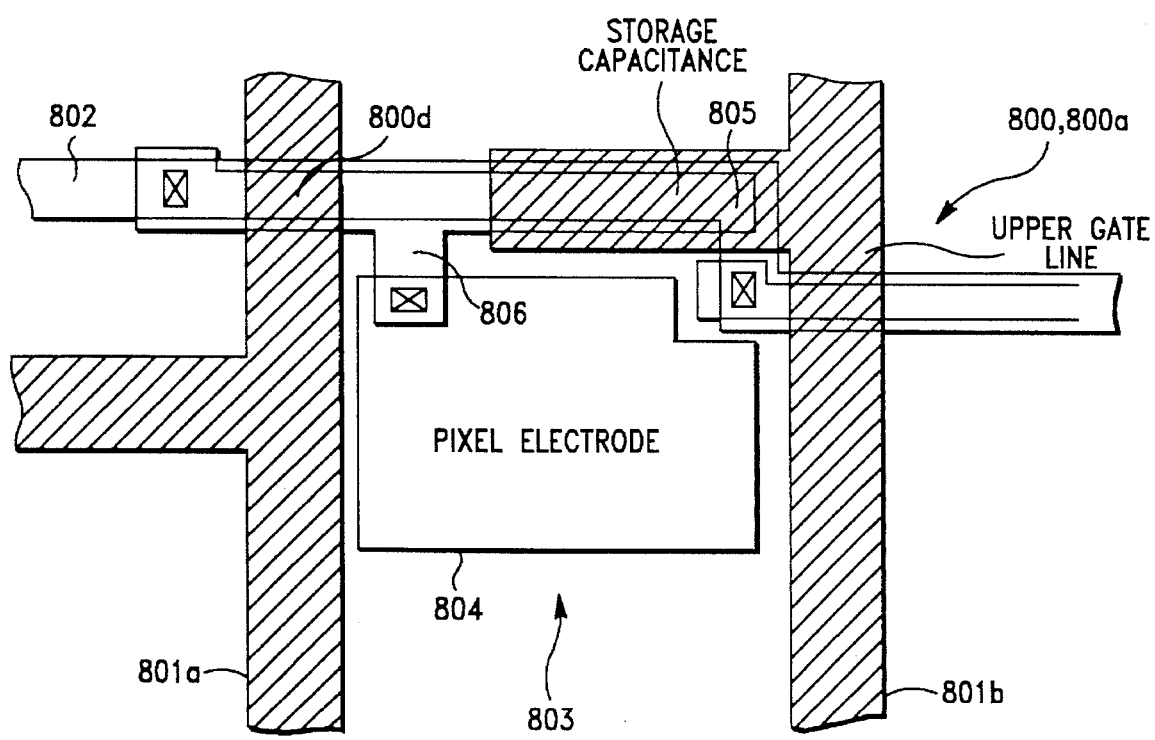
FIG.—13

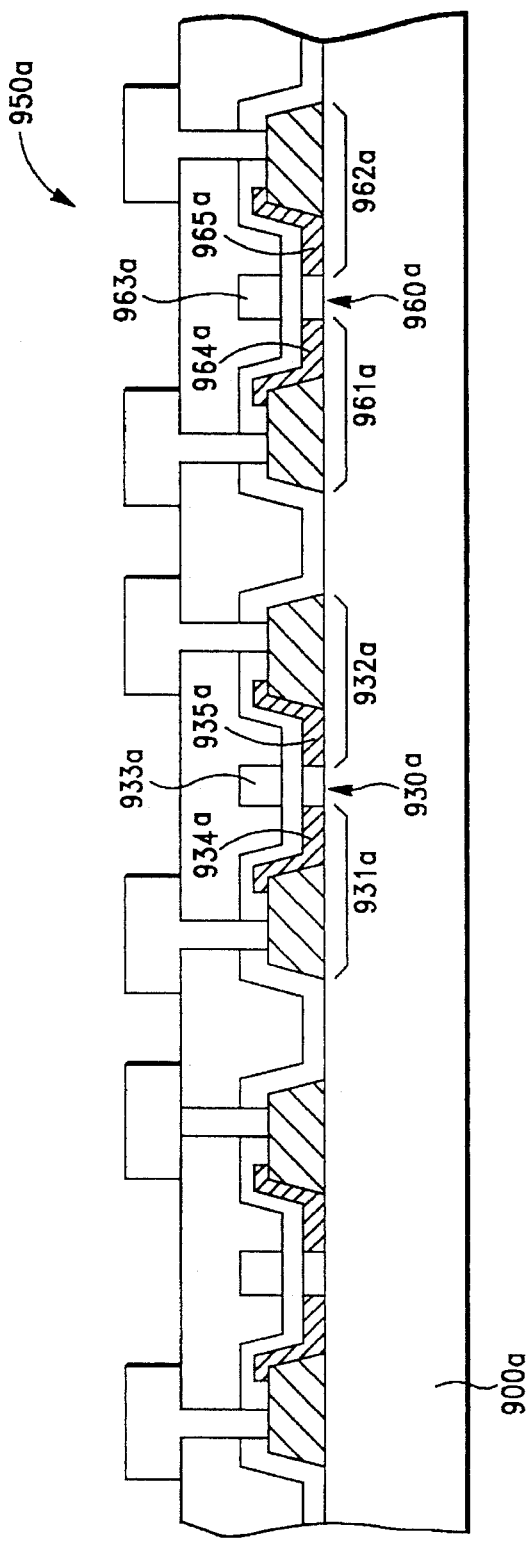
FIG.—14
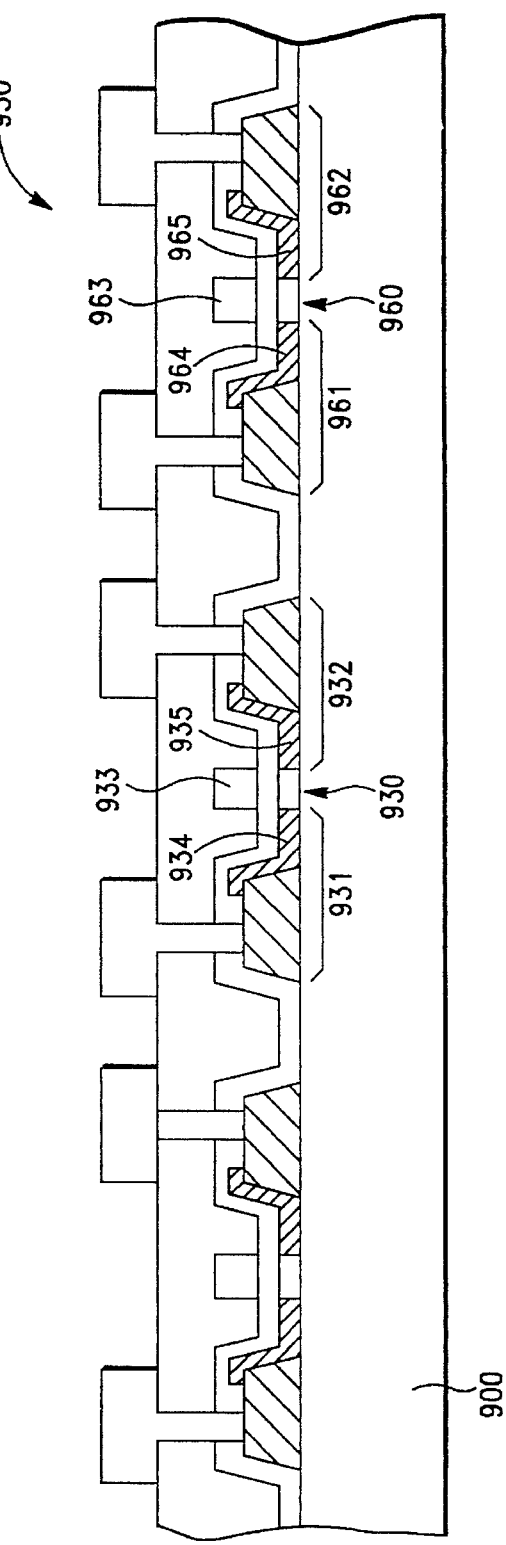
FIG.—15

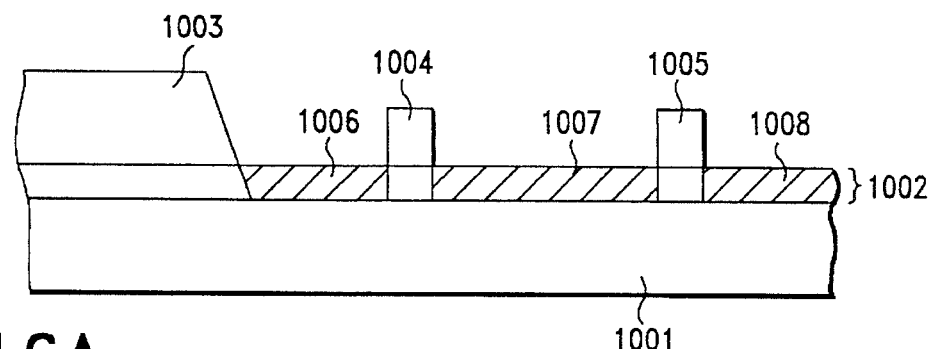
FIG.—16A
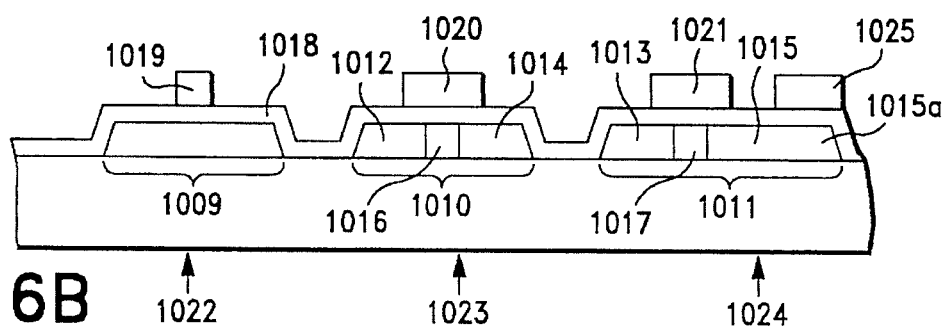
FIG.—16B
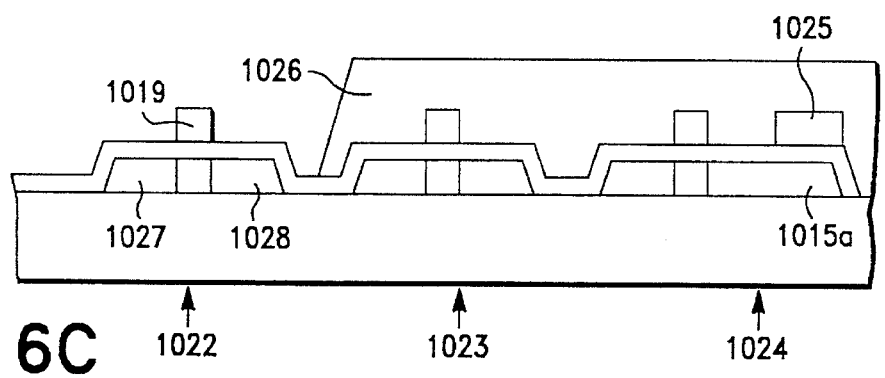
FIG.—16C
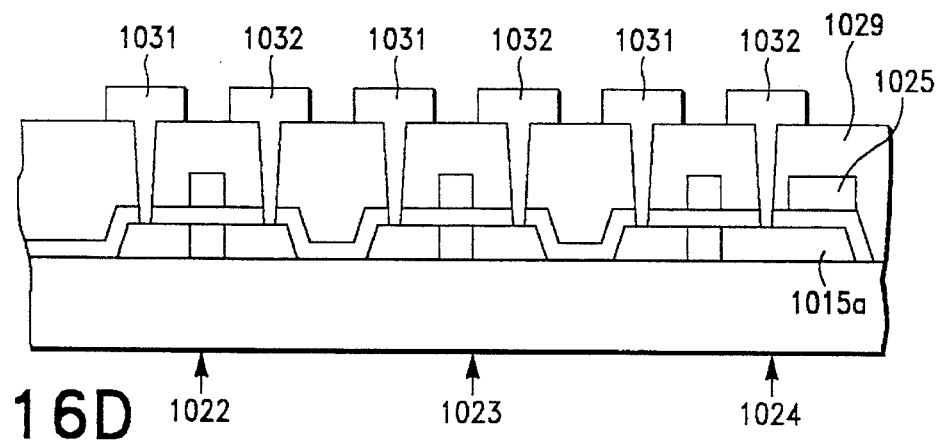
FIG.—16D

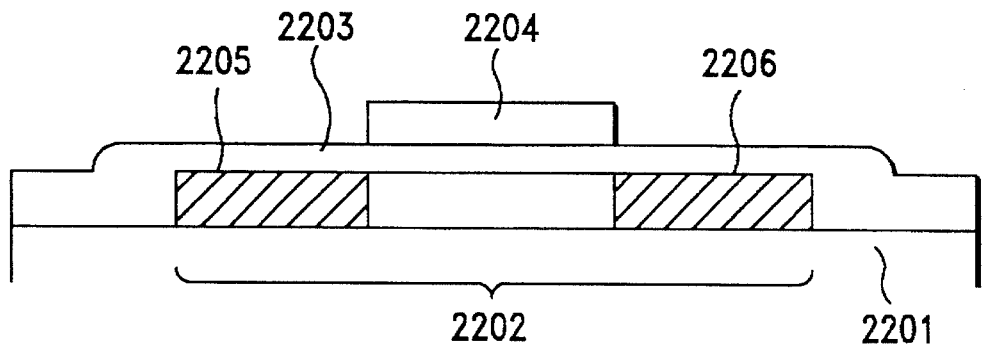
FIG.—20
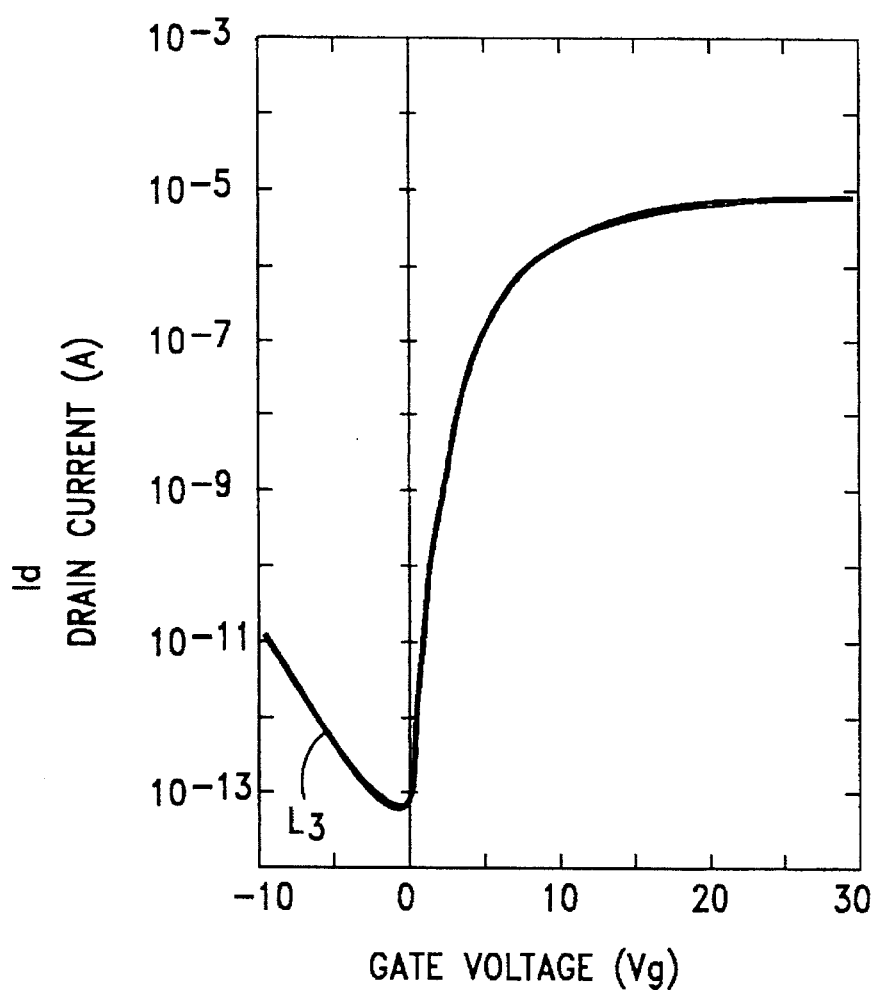
FIG.—21

THIN FILM TRANSISTOR, SOLID DEVICE, DISPLAY DEVICE AND MANUFACTURING METHOD OF A THIN FILM TRANSISTOR

BACKGROUND OF THE INVENTION

The present invention relates to a thin film transistor, a solid device such as a semiconductor device, a display device such as a liquid crystal display panel, and a manufacturing method of a thin film transistor. More particularly, the present invention pertains to a technique of improving electrical characteristics of a thin film transistor.

In an active matrix substrate of a liquid crystal display panels, for example, a thin film transistor on board as its switching element is shown in FIG. 20. The transistor is formed in such a way that after a gate oxidation film 2203 is formed on a silicon layer 2202 on the surface of a substrate 2201, a source area 2205 and a drain area 2206 are self-aligned by implanting ions to silicon layer 2202 with a gate electrode 2204 on the surface of 2203 as a mask so as to make a part of the silicon layer electrically-conductive. However, there is a problem associated with the thin film transistor having a structure shown in FIG. 20. As shown by a solid line L3 in FIG. 21, a large intense drain current flows even when a negative gate voltage is applied (in off state) to a gate electrode 2204. This could be understood as a phenomenon in which at the end of drain area 2206 which is biased in the opposite direction, a pn-junction breaks and a hole is implanted. The intensity of a drain current is dependent on the voltage applied between gate electrode 2204 and drain area 2206 and the density of a trap energy level in a silicon layer corresponding to drain area 2206 and an end of gate electrode 2204 near drain area 2206. Accordingly, a structure may be used where a ratio of on-off current is increased by employing a drain structure whose field strength is weakened (LDD structure) by establishing a low concentration area at an end of a drain area corresponding to an end of a gate electrode. In order to manufacture a thin film transistor with this LDD structure, the following manufacturing method has been adopted conventionally. First, as is shown in FIG. 22A, after a pattern 2402 comprising a silicon film has been formed on the surface of a substrate 2401, the pattern is covered with a gate insulation film 2403, on the surface of which an electrically-conductive film 2404 is formed and constitutes a gate electrode.

Second, as is shown in FIG. 22B, a resist pattern 2405 is formed on an electrically-conductive film 2404 by employing a photolithography technique. By performing an etching selectively, with the resist pattern 2405 used as a mask, a gate electrode 2406, which is thinner than the resist pattern, is formed.

Third, in an ion implantation method, by implanting impurities either as a donor or as an acceptor, and with an amount of as much as $1\times10^{15}\text{cm}^{-2}$ for instance, a source area 2407 and a drain area 2408 are formed in a self-aligned way, as in FIG. 22C. The area where ions are not implanted on account of gate electrode 2406 and resist pattern 2405 becomes a channel area 2409.

Fourth, resist pattern 2405 is removed. In order to form an LDD structure, as is shown in FIG. 22D, by implanting impurities of about $1\times10^{14}\text{cm}^{-2}$ in an ion implantation method, with gate electrode 2406 as a mask, low concentration areas 2410 and 2411 are formed in an area in alignment with the ends of gate electrode 2406.

However, in the manufacturing method of a thin film transistor with a conventional LDD structure, after gate electrode 2406 is formed, then source area 2407, drain area 2408 and low concentration areas 2410 and 2411 are formed. Thus, when the silicon film to which impurities are implanted is heat-treated at about 1000° C. to activate the impurities, gate electrode 2406 is also heated. Therefore, only materials having high heat resistance such as a silicon compound can be used for gate electrode 2406, which is at the expense of the electric resistance and other characteristics of the gate electrode. In such a case, if signals are transmitted along the wires formed simultaneously with gate electrode 2406, as in an active matrix substrate of a liquid crystal display panel, the signals are attenuated much on account of the high electric resistance. There is an alternative method in which the impurities are activated by irradiating a laser beam partially on the transistor without giving heat stress to gate electrode 2406. In this method, the density of the trap energy level is increased because the crystalline state which was disturbed by the implantation of impurities cannot be restored sufficiently. Hence, the off current increases, and the LDD structure becomes useless.

In light of the above problems, an object of the present invention is to fabricate a thin film transistor, a solid device such as a semiconductor device, a display device such as a liquid crystal display panel, which have improved electrical characteristics such as off-current characteristics by improving the composition of the source and drain areas and the gate electrode.

SUMMARY OF THE INVENTION

In order to solve the above-mentioned problems, in a thin film transistor according to the present invention, a channel area is formed between a source area and a drain area on the surface of a substrate. A gate electrode overlaps the channel area through a gate insulation film. In the source area and drain area, an area which overlaps an end of the gate electrode through the gate insulation film is a low concentration area formed in a process prior to that of the gate electrode. The impurity concentration of that area is under $1\times10^{20}\text{cm}^{-3}$, for instance. In other words, the source area and drain area each have areas which are formed in a process prior to that of the gate electrode and are low concentration areas overlapping the gate electrode. Alternatively, the source area and drain area themselves are low concentration areas formed in a process prior to that of the gate electrode and their ends overlap the gate electrode.

In a thin film transistor according to the present invention, the source area and drain area are not formed by implanting impurities with the gate electrode being used as a mask, but are formed before the gate electrode is formed. Accordingly, when the implanted impurities are activated, the gate electrode has not been formed yet. Therefore, it is possible to activate the impurities without being restricted by the heat resistance of the materials of the gate electrode. More particularly, when a thin film transistor is formed in a low-temperature process, since the channel area can be crystallized after the implantation of impurities, the density of the trap energy level can be reduced in the drain area overlapping an end of the gate electrode and its neighborhood. Furthermore, since the low concentration areas of the source area and drain area overlaps the gate electrode, the electric field strength at the end of the gate electrode is small. Hence, the improvement of the off current characteristics of the thin film transistor can be obtained.

When the thin film transistor according to the present invention is formed in a low-temperature process in which the highest temperature is restrained under about 600° C., it is desirable to have the activation process for forming the low concentration areas serve as a crystallization treatment of the channel area at the same time.

In other words, after a silicon film for constituting a low concentration area and a channel area is formed, impurities are selectively implanted. Then the crystallization treatment is performed and the impurities are activated at the same time. As to the crystallization treatment, the following methods can be used: a laser annealing method in which the silicon film is crystallized by irradiating a laser beam to it and the impurities are activated simultaneously; a solid phase crystallization method (SPC method) in which the silicon film is crystallized by annealing it for a long time at a low temperature and the impurities are activated at the same time; or a rapid thermal annealing method (RTA method) in which the silicon film is crystallized by lamp annealing it and the impurities are activated simultaneously.

In the present invention, it is desirable to reduce the parasitic resistance by forming a low resistance area with a high impurity concentration which is connected to a low concentration area, or by forming a low resistance area with a thick film respectively in the source area and drain area which is connected to a low concentration area. It is also possible to form the channel area, source area and whole drain area or a part of it in a different process.

It is desirable for a film in the low concentration area to have the same thickness as that of the channel area. Or it is desirable to make the thickness of the film in the low concentration area thinner than the thickness of a depletion layer. The thickness of the depletion layer is determined by the impurity concentration in the low concentration area when a potential is applied to the gate electrode. The thickness of the film in the low concentration area is set to, for instance, under about 500Å.

Such a thin film transistor can be used in various solid devices such as a three-dimensional integrated circuit (semiconductor device) and an image sensor. It is also possible to make a display device such as a liquid crystal display panel with the thin film transistor of the present invention being used as a pixel transistor in a pixel area of an active matrix array. In this case, for example, it is possible to constitute the thin film transistor of the present invention using an n-channel type thin film transistor. In a CMOS circuit of a drive circuit area formed on the same substrate together with an active matrix array, it is possible to use an n-channel type thin film transistor of the same structure and a p-channel type thin film transistor formed in a self-aligned way relative to a gate electrode. As another combination, in conversing the structure of an n-channel type thin film transistor and a p-channel type thin film transistor, it is possible for the p-channel type thin film transistor to have the structure of the present invention, and for the p-channel type thin film transistor to have a self-aligned structure. In this case, the pixel part is constituted of a p-channel type thin film transistor.

In the pixel part, a thin film transistor according to the present invention is used. In the drive circuit formed on the same substrate together with the active matrix array, an n-channel type thin film transistor and a p-channel type thin film transistor which are formed in a self-aligned way relative to the gate electrode can be used to constitute the CMOS circuit.

Whichever combination is employed to constitute the thin film transistor in the pixel part and the drive circuit, the impurity concentration of each area should be, for instance, over about $1 \times 10^{20} cm^{-3}$ in the source area and drain area of a self-aligned thin film transistor and under about $1 \times 10^{20} cm^{-3}$ in a low concentration area of a non-self-aligned thin film transistor. As to thin film transistors formed on the substrate, the film thickness of source and drain areas of a self-aligned thin film transistor may sometimes be the same as that of a low concentration area of a non-self-aligned thin film transistor.

In an active matrix array, a storage capacitance is usually connected in series to a drain area of a thin film transistor constituting the pixel area. The storage capacitance can be formed, for example, with a scanning line in prior stage as an upper electrode, a gate insulation film of the thin film transistor as a capacitor insulation film, and an extended area formed by extending the drain area as a lower electrode.

However, when a thin film transistor is made employing a conventional technique, i.e., when the source and drain areas are formed after the gate electrode is formed, ions cannot be implanted to the lower part after the gate electrode is formed. Therefore, a process needs to be added to form a lower electrode under the gate line of the prior stage. In the thin film transistor according to the present invention, by contrast, since at least the low concentration area is formed before the gate electrode is formed, an extended area can be made in the drain area as a lower electrode.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 1 is a sectional view showing a structure of a thin film transistor according to the first embodiment of the present invention;

FIG. 3A is an illustration showing a parasitic capacitance of the thin film transistor shown in FIG. 1; FIG. 3B is an illustration showing a parasitic capacitance of the thin film transistor according to the comparative embodiment;

FIGS. 4A to 4D are process sectional views showing a part of a manufacturing method for the thin film transistor shown in FIG. 1;

FIG. 12 is a block diagram showing a constitution of a liquid crystal display panel;

FIG. 13 is a plan view showing a constitution of each pixel area in a pixel part of the liquid crystal display panel shown in FIG. 12;

FIG. 14 is a sectional view of a thin film transistor formed on an active matrix substrate of a liquid crystal display panel according to the eighth embodiment of the present invention;

FIG. 15 is a sectional view of a thin film transistor formed on an active matrix substrate of a liquid crystal display panel according to the ninth embodiment of the present invention;

FIGS. 16A to 16D are process sectional views showing a part of a manufacturing method for a thin film transistor formed on an active matrix substrate of a liquid crystal display panel according to the tenth embodiment of the present invention;

FIG. 20 is a sectional view showing a constitution of a transistor;

FIG. 21 is a graph showing the off current characteristics of a conventional thin film transistor.

DESCRIPTION OF THE PREFERRED EMBODIMENTS

First Embodiment

Figure 2B:
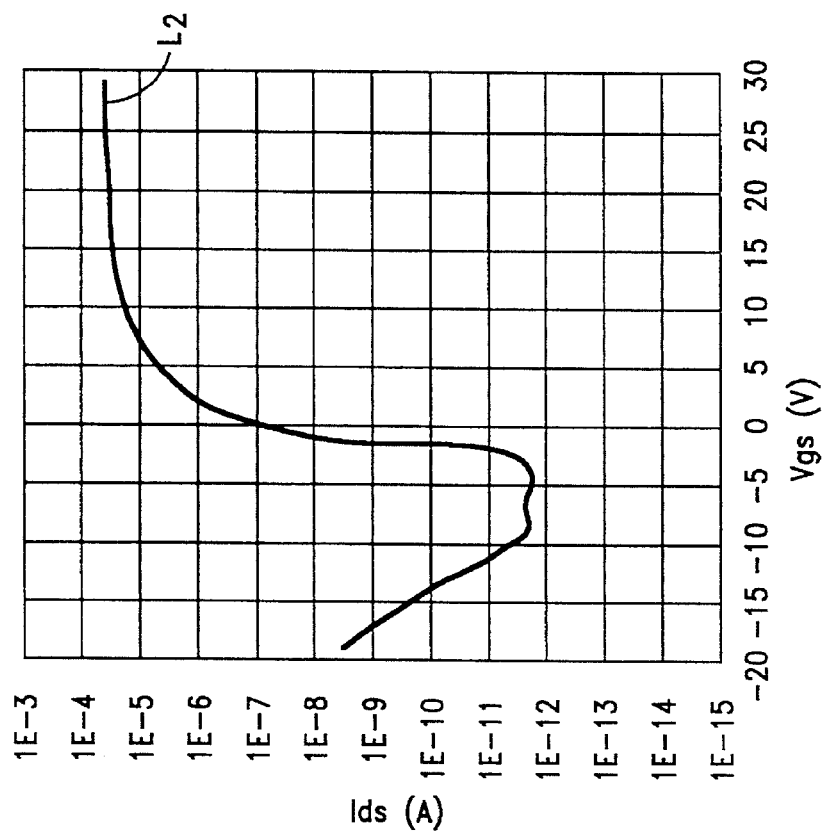
FIG. 2B is a graph showing off the current characteristics of the thin film transistor according to the comparative embodiment.

FIG. 1 is a sectional view of a thin film transistor 110 according to the first embodiment.

In this figure, thin film transistor 110 is formed on an insulation substrate 111 made from glass, quartz or sapphire, etc. Transistor 111 includes an n− source area and an n− drain area 113 comprising an n− type silicon film (low concentration area) with the thickness of under about 500Å, for example, about 400Å, to which about $1\times10^{19} cm^{-3}$ of phosphorus is added, and a channel area 114 which lies between source area 112 and drain area 113 and connects these areas. Source area 112, drain area 113 and channel area 114 are silicon films made by crystallizing amorphous silicon. Since source area 112, drain area 113 and channel area 114 depend on the presence of impurities, the film thickness of source area 112, drain area 113 and channel area 114 are approximately the same, i.e., about 400Å. A gate insulation film 115 made of an insulation film such as a silicon oxidation film is formed on the surfaces of source area 112, drain area 113 and channel area 114. A gate electrode 116 is formed on gate insulation film 115. This gate electrode 116 is made from materials suitable for the devices using thin film transistor 110, such as metal or a transparent electrically-conductive film. Gate electrode 116, source area 112 and drain area 113 are not made by self-alignment. The overlapping area of one side end 117 of gate electrode 116 and an end 118 of source area 112, and that of the other side end 119 of gate electrode 116 and an end 120 of drain area 113 are relatively large. Note that 121 is an interlayer insulation film. Through contact holes 122 and 123, a source electrode 124 and a drain electrode 125 are electrically connected to source area 112 and drain area 113, respectively.

In a structure such as that of thin film transistor 110, since n− source area 112 and n− drain area 113 are formed before gate electrode 116 is formed, when implanted impurities are activated in forming n− source area 112 and n− drain area 113, gate electrode 116 is not formed yet. Accordingly, if an LCD with a large area or a high pixel density LCD is fabricated using a metal electrode with low sheet resistance, for instance, on gate electrode 116, the heat resistance of the metal electrode does not restrict the activation condition of the impurities implanted to n− source area 112 and n− drain area 113. In other words, since the impurities implanted to n− source area 112 and n− drain area 113 can be activated sufficiently, and at the same time the crystalline state which was disturbed by the implantation of impurities can be restored adequately, the density of the trap energy level at end 120 of n− drain area 113 corresponding to the other side end 119 of gate electrode 116 and its neighborhood can be reduced. And since n− drain area 113 is a low concentration area, the electric field strength is small near gate electrode 116. Hence, the off current characteristics of thin film transistor 110 are improved.

Figure 2A:
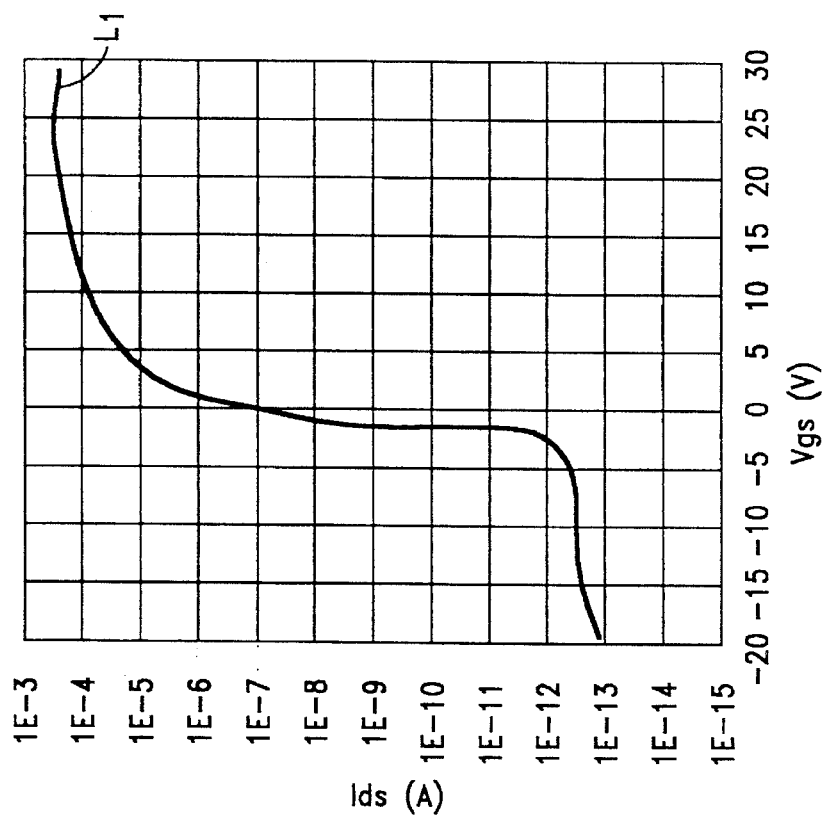
FIG. 2A is a graph showing the off current characteristics of the thin film transistor shown in FIG. 1.

Moreover, drain area 113 and its neighborhood are thin and are both about 400Å thick. The density of the trap energy level which may cause an off current tends to increase as the film becomes thick. Therefore, as drain area 113 and its neighborhood are thin, the density of the trap energy level in the areas is decreased, which further reduces the off current. In FIG. 2A the gate voltage-drain current characteristics of various thin film transistors in which n− drain area 113 and its neighborhood are 400Å are shown by a solid line L1. In FIG. 2B the gate voltage-drain current characteristics of various thin film transistors in which the drain area and its neighborhood are 2000Å are shown by a solid line L2. From FIGS. 2A and 2B, it is confirmed that an off current is smaller in the embodiment in which the drain area and its neighborhood are thinner (400Å thick). Thus, the off current characteristics of a thin film transistor according to the present embodiment are better.

Furthermore, in thin film transistor 110 according to the present embodiment, drain area 113 near an end of gate electrode 116 is flat, and hence an electric field convergence occurs less often between the other side end 119 of gate electrode 116 and an end 120 of drain electrode 113.

In thin film transistor 110 of the present embodiment, although the overlapping area of source area 112, drain area 113 and gate electrode 116 is large, the amount of impurities implanted to source area 112 and drain area 113 is about $1\times10^{19} cm^{-3}$ while the thickness of the film is about 400Å. Therefore, the parasitic capacitance between gate electrode 116 and source area 112, for instance, is minimum. In other words, in this embodiment, the thickness of the depletion layer created by the potential between gate electrode 116 and source area 112 is determined by the impurity concentration of source area 112 if the potential is fixed. The thickness of source area 112 is set so that the depletion layer may reach the lower surface of source area 112. More specifically, when a potential is applied between gate electrode 116 and source area 112, as shown in FIG. 3A, the first capacity C1 corresponding to gate insulation film 115, the second capacity C2 corresponding to a depletion layer 126, and the third capacity C3 corresponding to a side of substrate 111 are connected in series, and their combined capacity is small. By contrast, when source area 112 is thick, as shown in FIG. 3B, the lower surface of depletion layer 126 lies halfway in the thickness direction of source area 112. Only the first capacity C1 corresponding to gate insulation film 115 and the second capacity C2 corresponding to depletion layer 126 are connected in series so their combined capacity is large. Here the thickness of source area 112 is set to about 400Å according to the impurity concentration, $1 \times 10^{19}$ cm$^{-3}$ but the thickness of source area 112 can be set so that depletion layer 126 may reach the lower surface of source area 112 bordering a side of substrate 111 according to the impurity concentration. Source area 112 may sometimes be as thin as about 100Å in considering the limitation of a process on control of impurity concentration.

FIGS. 4A to 4D illustrate a manufacturing method for a thin film transistor according to this embodiment.

FIGS. 4A to 4D are all process sectional views showing a part of a manufacturing method for a thin film transistor in this embodiment.

First, as is shown in FIG. 4A, on the surface of an insulation substrate 211, a resist pattern 203 is formed employing a photolithography technique after an amorphous silicon film is built up in a low-temperature process, for instance, a sputtering process or an LPCVD method in an atmosphere at the temperature of 550° C. to 600° C. The amorphous silicon film is patterned to form a pattern 202 (amorphous silicon film). Although it is possible to implant impurities after the amorphous silicon film is crystallized by the irradiation of a laser beam, the implantation of impurities causes the crystalline state to be disturbed, and therefore another restoration treatment will be necessary. Accordingly, in this embodiment, after the implantation of impurities, a crystallization treatment is performed, which activates the impurities at the same time.

In other words, after an amorphous silicon film is patterned, resist pattern 203 is removed. As shown in FIG. 4B, after another resist pattern 204 is formed by ion implantation of phosphorus and using 204 as a mask, an n– source area 212 (low concentration area) and an n– drain area 213 (low concentration area) having an impurity concentration of about $5 \times 10^{18}$ cm$^{-3}$ are formed. On pattern 202 of an amorphous silicon film, an area to which phosphorus was not implanted becomes a channel area 214.

Then, after resist pattern 204 is removed, amorphous silicon film is annealed by irradiating a laser beam to polycrystallize the amorphous silicon film and to activate the implanted impurities simultaneously. Alternatively, the amorphous silicon film is annealed for about four hours in a nitrogen atmosphere at the temperature of about 600° C., for example, (solid phase crystallization method: SPC method) to crystallize the amorphous silicon film and simultaneously to activate the implanted impurities. In this case, if it is necessary, a plasma hydrogen treatment is performed in an atmosphere at the temperature of 350° C., or an amorphous silicon film is rapidly-thermally-annealed both to crystallize the amorphous silicon film and to activate the implanted impurities.

Next, as is shown in FIG. 4C, after a gate insulation film 215 is formed on the surface of an amorphous silicon film (source area 212) drain area 213, and channel area 214), a gate electrode 216 made from such a material as metal is formed on the surface of the gate insulation film 215. Side ends 217 and 218 of gate electrode 216 overlap the ends 219 and 220 of source area 212 and drain area 213.

Subsequently, as is shown in FIG. 4D, after an interlayer insulation film 221 is formed on the surface of gate electrode 216, contact holes 222 and 223 are made on it. By using these contact holes 222 and 223, as shown in FIG. 1, a source electrode 124 and a drain electrode 125 are connected to source area 212 and drain area 213 respectively to complete fabrication of thin film transistor 110.

As is clear from the above discussion, in the manufacturing method for a thin film transistor 110 according to this embodiment, after the impurities are implanted to a silicon film such as an amorphous silicon film, a crystallization treatment is performed on the amorphous silicon film, and the crystallization treatment itself activates the impurities at the same time. Furthermore, because in the subsequent processes, impurities are not implanted, these processes are simplified and the crystalline state of the silicon film after the crystallization treatment is not broken by the implantation of impurities, the density of the trap energy level does not increase. Hence, thin film transistor 110 with improved off current characteristics can be manufactured efficiently. Note that the silicon film can be a polycrystalline silicon film instead of the amorphous silicon film used in this embodiment.

Second Embodiment

Figure 5A:
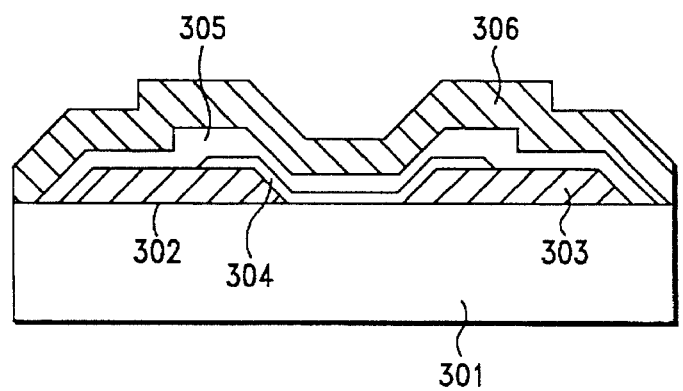
FIGS. 5A to 5C are process sectional views showing a part of a manufacturing method for a thin film transistor according to the second embodiment of the present invention.
Figure 5B:
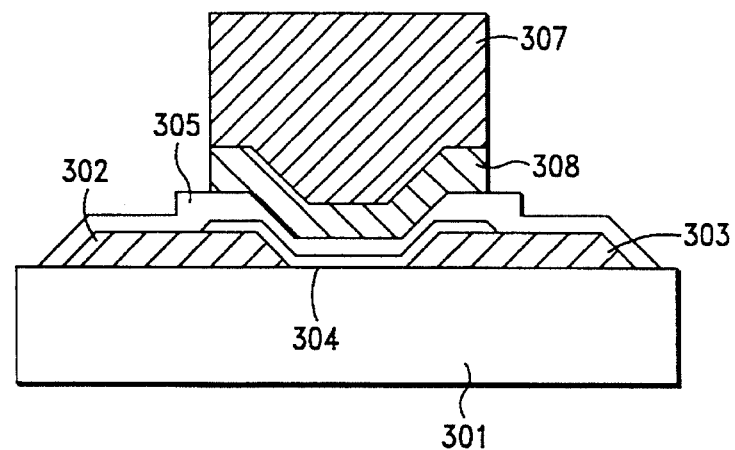
Figure 5C:
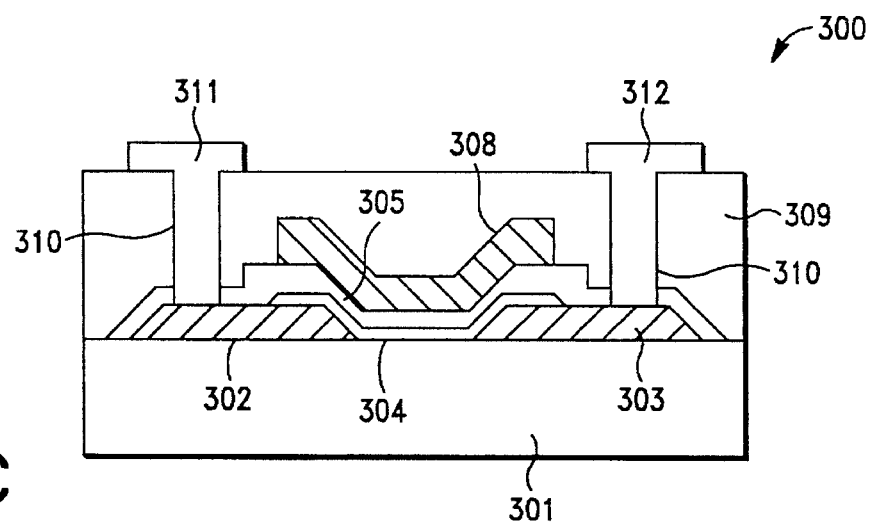

With reference to FIGS. 5A to 5C, a thin film transistor according to the second embodiment of the present invention and its manufacturing method will be explained below.

FIGS. 5A to 5C are process sectional views showing a part of a manufacturing process of a thin film transistor in this embodiment.

A thin film transistor in the present embodiment, like a thin film transistor in the first embodiment, has a structure shown in FIG. 5C with improved on-off characteristics.

A thin film transistor 300 has, on the surface of an insulation substrate 301 made from glass, quartz, sapphire, etc., an n– source area 302 (low concentration area) and an n– drain area 303 (low concentration area) to which about $1 \times 10^{20}$ cm$^{-3}$ of phosphorus is added. On the surfaces of substrate 301, source area 302, and drain area 303, transistor 300 has a channel area 304 comprising a thin film made from silicon such as polycrystalline silicon with a thickness of about 1000Å. Channel area 304 is connected to source area 302 and drain area 303. On the surfaces of source area 302, channel area 304 and drain area 303, there is a gate insulation film 305 such as a silicon oxidation film. One end of a gate electrode 308 overlaps source area 302 and drain area 303 through gate insulation film 305.

In order to manufacture thin film transistor 300 having such a structure, first, as is shown in FIG. 5A, after an n– silicon thin film made from such materials as polycrystalline silicon to which about $1 \times 10^{20}$ cm$^{-3}$ of phosphorus, for instance, is added is built up to about 1500Å on the surface of insulation substrate 301, the n– silicon thin film is etched selectively to form n– source area 302 (low concentration area) and n– drain area 303 (low concentration area). Subsequently, on the surfaces of source area 302 and drain area 303, channel area 304 comprising a silicon thin film made from such materials as polycrystalline silicon with a thickness of about 1000Å is formed, connecting source area 302 and drain area 303. Then the whole device is thermally oxidated to form gate insulation film 305 comprising a silicon oxidation film, on the surface of which gate electrode material 306 is formed, comprising metal, a transparent electrically-conductive film, a polycrystalline silicon film to which impurities are added, etc.

As is shown in FIG. 5B, on the surface of gate electrode material 306 where gate electrode is to be made, a resist pattern 307 is formed employing a technique such as a photolithography technique. With resist pattern 307 being used as a mask, gate electrode material 306 is selectively etched to form gate electrode 308. One end of gate electrode 308 overlaps an end of n− source area 302 and an end of n− drain area 303 through gate insulation film 305.

Then resist pattern 307 is removed. After that, as is shown in FIG. 5C, an interlayer insulation film 309 comprising a silicon oxidation film is formed as in a usual process. After a contact hole 310 is formed in interlayer insulation film 309, a source electrode 311 and a drain electrode 312, comprising metal, a transparent electrically-conductive film, etc., are connected to source area 302 and drain area 303, respectively.

As is clear from the above explanation, in thin film transistor 300 of the present embodiment, as in the thin film transistor in the first embodiment, since source area 302 and drain area 303 are formed before gate electrode 308 is formed, source area 302 and drain area 303 can be formed under an ideal condition and the materials for gate electrode 308 are not restricted by the heat resistance. Hence, the off current characteristics are improved.

Third Embodiment

With reference to FIGS. 6A to 6D, a thin film transistor according to the third embodiment of the present invention and its manufacturing method will be explained below.

FIGS. 6A to 6D are process sectional views showing a part of a manufacturing process for a thin film transistor in this embodiment.

A thin film transistor in this embodiment, compared with the thin film transistor in the first embodiment, has both improved on current characteristics and off characteristics by forming areas of different concentrations in a source are a and a drain area. As is shown in FIG. 6D, the transistor has, on the surface of an insulation substrate 401 made from such materials as glass, an n+ source area 412 (low resistance area of high concentration) and an n+ source area 405 (low concentration area) on the source are a side, and an n+ drain area 413 (low resistance area of high concentration) and an n− drain area 406 (low concentration area) on the drain area side. One end of a gate electrode 409 overlaps an end of n− source area 405 and an end of n− drain area 406 of low concentration through a gate insulation film 408. A source electrode 420 and a drain electrode 421 are connected to n+ source area 412 and n+ drain area 413 of high concentration respectively.

Figure 6A:
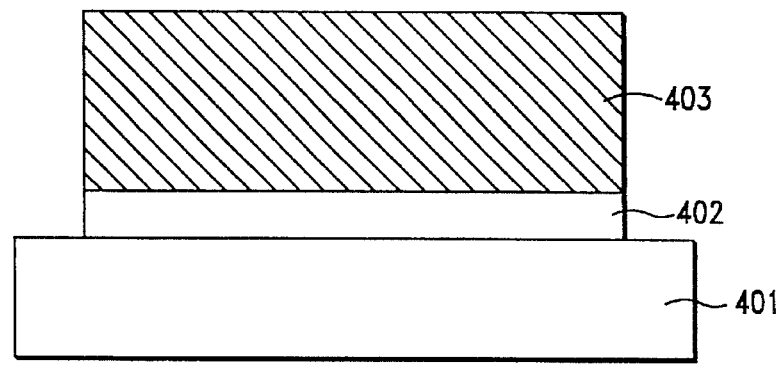
FIGS. 6A to 6D are process sectional views showing a part of a manufacturing method for a thin film transistor according to the third embodiment of the present invention.

In order to manufacture thin film transistor 400 having such a structure, first, as is shown in FIG. 6A, about 1500Å of a silicon thin film, made from polycrystalline silicon, etc., is built up on insulation substrate 401 made from materials such as glass. Subsequently, a resist pattern 403 is formed employing a technique such as a photolithography technique. With pattern 403 being used as a mask, the silicon thin film is selectively etched to form a silicon pattern 402.

Figure 6B:
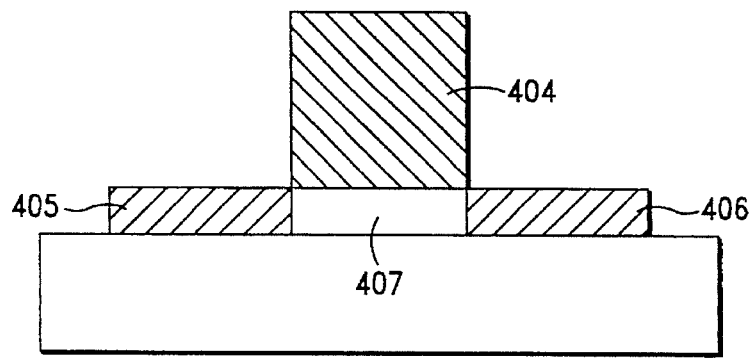

Second, after resist pattern 403 is removed, as is shown in FIG. 6B, a new resist pattern 404 is formed employing a technique such as a photolithography technique. With pattern 404 being used as a mask, phosphorus is ion implanted to silicon pattern 402 to form n− source area 405 and n− drain area 406 with thickness of about $1 \times 10^{18} cm^{-3}$. The area on which the ion implantation was not performed becomes a channel area 407.

Figure 6C:
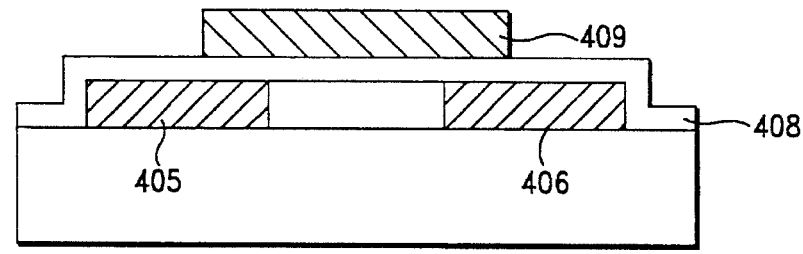
Figure 6D:
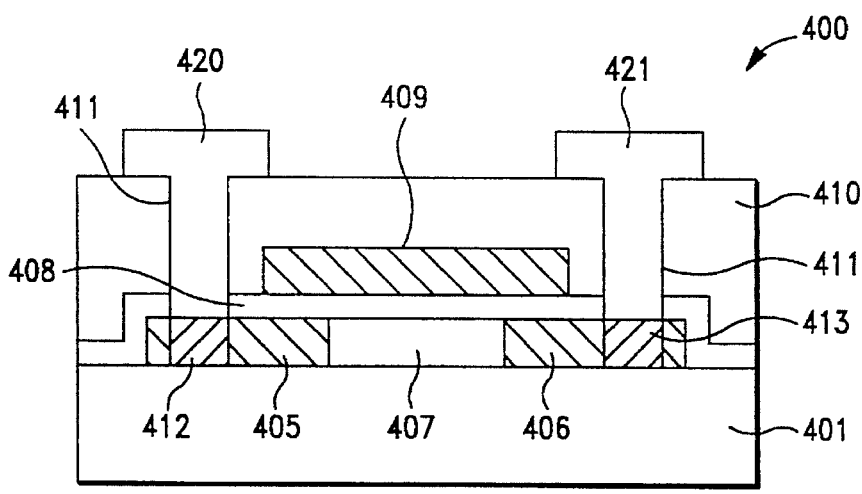

Third, after resist pattern 404 is removed, the whole device is thermally oxidated to form a gate insulation film 408 comprising a silicon oxidation film, as is shown in FIG. 6C. This heat-treating process also activates the implanted ions. Then gate electrode 409 is formed, comprising metal, a transparent electrically-conductive film, a polycrystalline silicon film to which impurities are added, etc. Gate electrode 409 overlaps a part of n− source area 405 and n− drain area 406 through gate insulation film 408.

Fourth, as is shown in FIG. 6D, after an interlayer insulation film 410 comprising a silicon oxidation film is formed, contact holes 411 are formed in it. Then with interlayer insulation film 410 being used as a mask, phosphorus is ion implanted to the device. At the same time the implanted ions are activated by irradiating a laser beam to form n+ source area 412 and n+ drain area 413 with a thickness of about $5 \times 10^{21} cm^{-3}$.

Subsequently, as in a usual manufacturing method, source electrode 420 and drain electrode 421, comprising metal, a transparent electrically-conductive film, etc., are connected to their respective n+ source area 412 and n+ drain area 413.

In thin film transistor 401 having such a structure, n− source area 405 and n− drain area 406 overlapping an end of gate electrode 409 are formed before gate electrode 409 is formed. Accordingly, if gate electrode 409 is made from materials such as metal, the impurities implanted to n− source area 405 and n− drain area 406 can be activated sufficiently without being restricted by the heat resistance of the material used for the gate electrode. At the same time the crystalline state disturbed by the implanted impurities can be adequately restored. Hence, the density of the trap energy level can be reduced at that end of n− drain area 406 and in its neighborhood. And since n-drain area 406 is a low concentration area, the electric field strength near gate electrode 409 is small. Hence, the off current characteristics of thin film transistor 401 are improved.

Furthermore, on the source area and drain area, the area which can influence such features as on-off characteristics is the low concentration area, while the area to which source electrode 420 and a drain electrode 421 are respectively connected is a high concentration area. Therefore, parasitic resistance is low and a large on current can be obtained.

Fourth Embodiment

Figure 7:
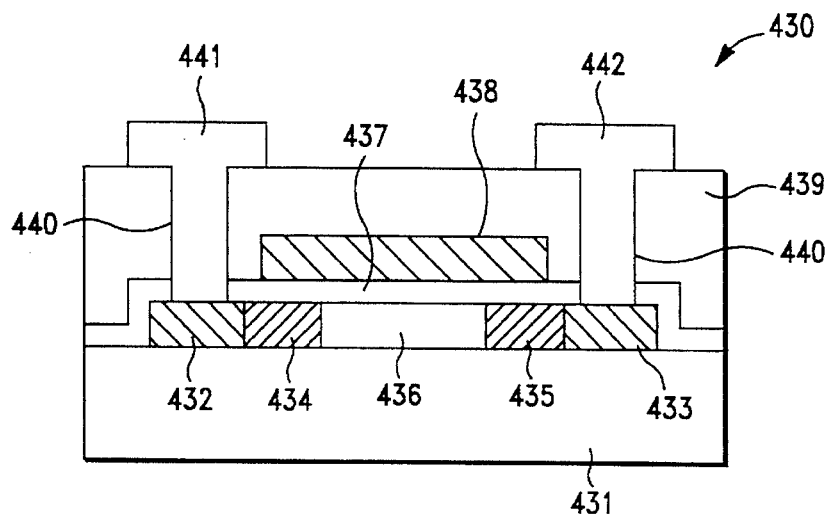
FIG. 7 is a sectional view showing a structure of a thin film transistor according to the fourth embodiment of the present invention.

Instead of the thin film transistor in the third embodiment, a thin film transistor illustrated in FIG. 7 can achieve improvement on-off characteristics and an on current.

FIG. 7 is a sectional view of a thin film transistor in this embodiment in the channel direction. A thin film transistor 430 has a pattern comprising a silicon thin film made from such materials as polycrystalline silicon on the surface of an insulation substrate 431 made from glass, quartz, sapphire, etc. This pattern has an n+ source area 432 and an n+ drain area 433 containing about $5 \times 10^{20} cm^{-3}$ of phosphorus, an n− source area 434 and an n− drain area 435 containing about $5 \times 10^{18} cm^{-3}$ of boron, and a channel area 436 containing about $1 \times 10^{17} cm^{-3}$ of boron. On their surfaces, there is a gate insulation film 437 comprising an insulation film such as a silicon insulation film, on the surface of which there is a gate electrode 438 comprising metal, a transparent electrically-conductive film, etc. One end of a gate electrode 438 overlaps the ends of an n− source are a 434 and an n− drain area 435 through gate insulation film 437. On their surface, there is an interlayer insulation film 439 comprising an insulation film such as a silicon oxidation film, and contact holes 440 are formed in it. A source electrode 441 and a drain electrode 442, comprising metal, a transparent electrically-conductive film etc., are connected to an n+ source area 432 an n+ drain area 433 respectively through contact holes 440. In thin film transistor 430 having such a structure, since no source area 434 and n− drain area 435 overlapping an end of gate electrode 438 are formed before gate electrode 438 is formed, if gate electrode 438 is made from materials such as metal, the impurities implanted to n− source area 434 and n− drain area 435 can be activated sufficiently without being restricted by the heat resistance of the material for the gate electrode. It also has an advantage that the crystalline state which was disturbed by the implanted impurities can be restored adequately.

Furthermore, on the source area and drain area, the area that can influence features such as on-off characteristics is a low concentration area, while there are also high concentration areas (n+ source area 432 and n+ drain area 433) connected to the source and drain electrodes. Therefore, parasitic resistance is low and a large on current can be obtained.

Fifth Embodiment

Next, with reference to FIGS. 8A to 8C, a thin film transistor according to the fifth embodiment of the present invention and its manufacturing method will be explained.

Figure 8A:
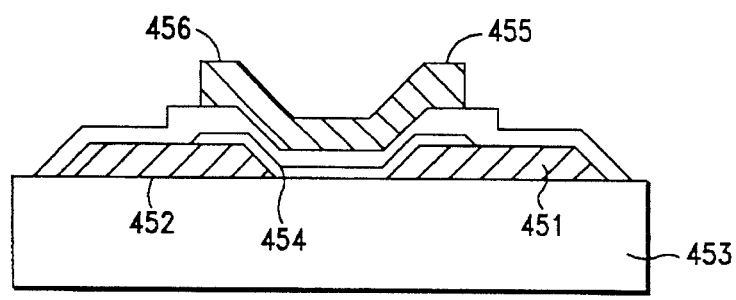
FIGS. 8A to 8C are process sectional views showing a part of a manufacturing method for a thin film transistor according to the fifth embodiment of the present invention.
Figure 8B:
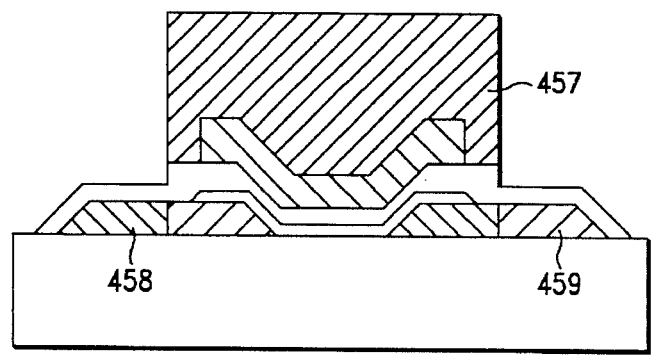
Figure 8C:
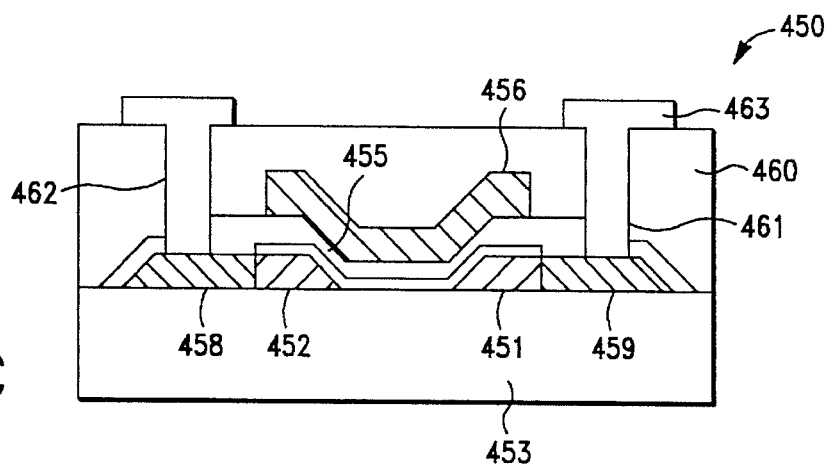

FIGS. 8A to 8C are process sectional views showing a part of a manufacturing process for a thin film transistor in this embodiment.

In the thin film transistor in this embodiment, compared to the thin film transistor in the second embodiment, by forming areas of different concentrations in a source area and a drain area, the on current characteristics and the off characteristics are improved. As is shown in FIG. 8C, on the surface of an insulation substrate 453 made from glass, etc., a thin film transistor 450 has, on the source area side, a p+ source area 458 (high concentration area) containing about $1 \times 10^{21} cm^{-3}$ of boron and a p− source area 452 (low concentration area) containing about $1 \times 10^{19} cm^{-3}$ of boron, and on the drain area side, a p+ drain area 459 (high concentration area) containing about $1 \times 10^{21} cm^{-3}$ of boron and a p− drain area 451 (low concentration area) containing about $1 \times 10^{19} cm^{-3}$ of boron. One end of gate electrode 456 overlaps p− source area 452 and p− drain area 451 of low concentration through a gate insulation film 455, while a source electrode 462 and a drain electrode 463 are connected to p+ source area 458 and p+ drain area 459 of high concentration respectively.

In order to fabricate thin film transistor 450 having such a structure, first, as is shown in FIG. 8A, a silicon thin film of low concentration, made from polycrystalline silicon, etc. and with a thickness of about 1500Å, to which about $1 \times 10^{19} cm^{-3}$ of boron is added, is formed on insulation substrate 453 made from glass, quartz, sapphire, etc. Then by selectively etching the silicon thin film, p− source area 452 and p− drain area 451 are formed. On the surfaces of p− source area 452 and p− drain area 451, a channel area 454 comprising a silicon thin film made from materials such as polycrystalline silicon with a thickness is 250Å is formed. Channel area 454 is connected to source area 452 and drain area 451. Then, gate insulation film 455 comprising a silicon oxidation film is formed on the whole surface by employing an ECR-CVD method. And gate electrode 456 is formed comprising metal, a transparent electrically-conductive film, polycrystalline silicon film to which impurities are added, etc. One end of gate electrode 456 overlaps an end of p− source area 452 and an end of p− drain area 453 through gate insulation film 455. Then, as is shown in FIG. 8B, a resist pattern 457 is formed to cover a fixed area of p− source area 452 and p− drain area 453 employing a technique such as a light exposure technique. With the pattern 457 being used as a mask, boron is ion implanted. And impurities are activated by irradiating a laser beam.

Resist pattern 457 is removed. Afterwards, as in a usual process, as is shown in FIG. 8C, after an interlayer insulation film 460 comprising a silicon oxidation film is formed, a contact hole 461 is formed in it. Then source electrode 462 and drain electrode 463, comprising metal, a transparent electrically-conductive film etc., are connected to p+ source area 458 and p+ drain area 453, respectively.

In thin film transistor 450 fabricated in this way, since p− source area 452 and p− drain area 453 are formed before gate electrode 456 is formed, it has the improved characteristics similar to those of the thin film transistor in the second embodiment. Furthermore, since p+ source area 458 and p+ drain area 459 are formed, transistor 450 has small parasitic resistance and can obtain a large on current.

Sixth Embodiment

Figure 9:
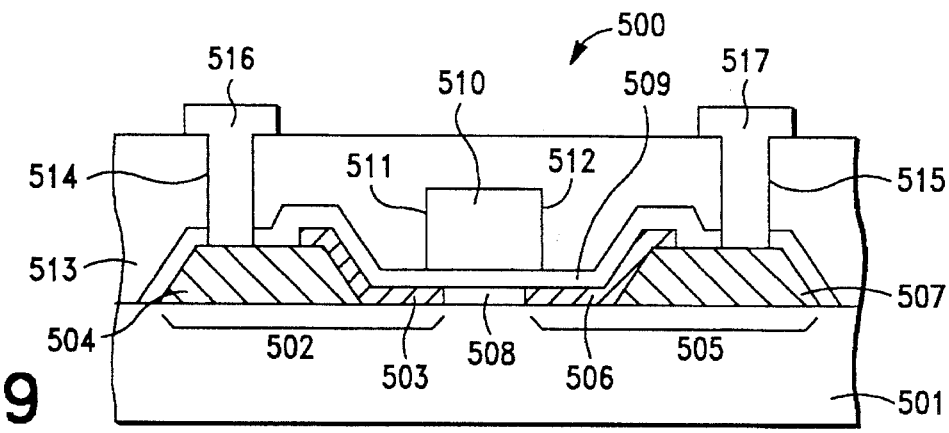
FIG. 9 is a sectional view showing a structure of a thin film transistor according to the sixth embodiment of the present invention.

FIG. 9 is a sectional view showing a structure of a thin film transistor according to the sixth embodiment of the present invention.

In this figure, a thin film transistor 500 in this embodiment is also formed on an insulation substrate 501 made from glass, quartz, sapphire, etc. Its source area 502 has a p− source area 503, which is a p− silicon film with a thickness of about 500Å to which about $1 \times 10^{18} cm^{-3}$ of boron is added, and a p+ source area 504 (thick, low resistance area of high concentration), which is a p+ silicon film with a thickness of about 2000Å to which about $1 \times 10^{21} cm^{-3}$ of boron is added. A drain area 505, on the other hand, has a p− drain area 506, which is a p− silicon film with a thickness of about 500Å to which about $1 \times 10^{18} cm^{-3}$ of boron is added, and a p+ drain area 507 (thick, low resistance area of high concentration), which is a p+ silicon film with a thickness of about 2000Å to which about $1 \times 10^{21} cm^{-3}$ of boron is added. Between source area 502 and drain area 505, there is a channel area 508, comprising a silicon film, etc. Channel area 508 is connected to areas 502 and 505. A gate insulation film 509, comprising an insulation film such as a silicon oxidation film covers all the areas. A gate electrode 510, made of materials such as metal and a transparent electrically-conductive film, is formed on the surface of this gate insulation film 509. Gate electrode 510, source area 502 and drain area 505 are not formed in a self-aligned way. One side end 511 of gate electrode 510 and an end of p− source area 503 of a source area 502 are arranged with a relatively large overlapping area. Similarly, the other side end 512 of gate electrode 510 and an end of p− drain area 506 of drain area 505 are arranged with a relatively large overlapping area. A source electrode 516 and a drain electrode 517 are electrically-conductively connected to p+ source area 504 of source area 502 and p+ drain area 507 of drain area 505, respectively, through contact holes 514 and 515, respectively, in an interlayer insulation film 513.

In thin film transistor 500 having such a structure, since p– drain area 506 overlaps gate electrode 510 on the side of drain area 505, for example, the electric field strength near gate electrode 510 is small. Hence, the off current characteristics are improved.

Source area 502 and drain area 505 are not formed in a self-aligned way relative to gate electrode 5 10. In other words, source area 502 and drain area 505 are not formed by an ion implantation with gate electrode 510 being used as a mask. Instead, they are formed before gate electrode 510 is formed. Therefore, impurities implanted to the source area and drain area can be activated without being restricted by the heat resistance limit of the gate electrode, even if the heat resistance of gate electrode 510 is as low as 600° C., for instance. Accordingly, since the crystalline state which was disturbed by the implantation of impurities can be restored sufficiently, the density of the trap energy level of drain area 505 corresponding to an end of gate electrode 510 and its neighborhood can be reduced. Hence, the off current characteristics of thin film transistor 500 are further improved.

A manufacturing method for a thin film transistor being such a structure will be explained by referring to FIGS. 10A to 10C.

Figure 10A:
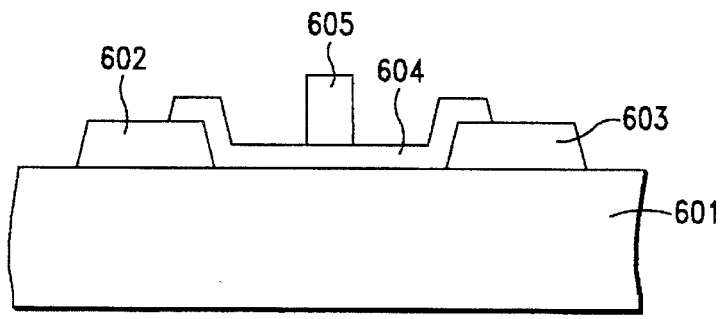
FIGS. 10A to 10C are process sectional views showing a part of a manufacturing method for the thin film transistor shown in FIG. 9.
Figure 10B:
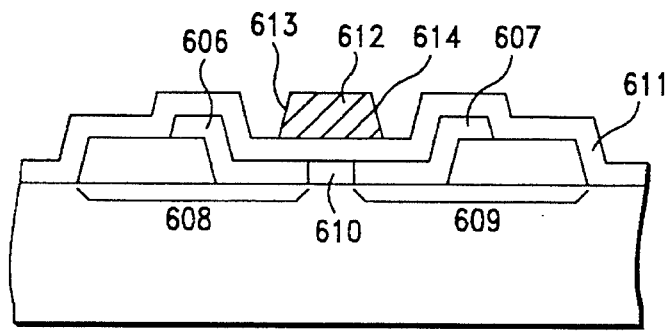
Figure 10C:
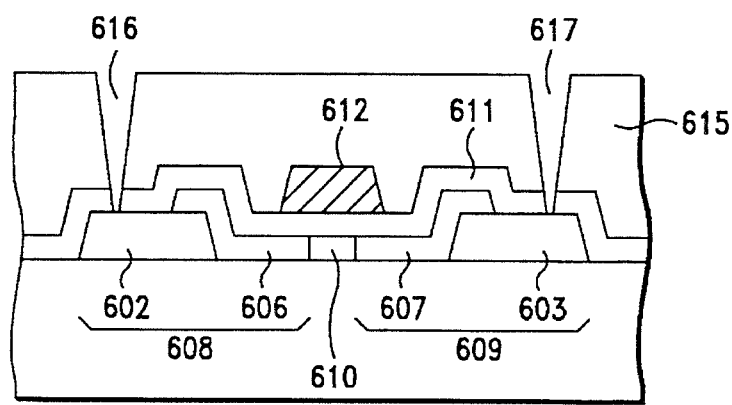

FIGS. 10A to 10C are process sectional views showing a part of a manufacturing method for a thin film transistor in this embodiment.

First, as is shown in FIG. 10A, on an insulation substrate 601 made from glass, quartz, sapphire, etc., an amorphous silicon thin film with a thickness of about 2000Å to which about $1 \times 10^{20} cm^{-3}$ of boron is added, for instance, is built up in a low-temperature process. By selectively etching the amorphous silicon thin film, p+ areas 602 and 603 are formed.

Second, on the surface of p+ areas 602 and 603, about 250Å of an amorphous silicon film 604 is formed in such a way as to connect areas 602 and 603. Then a resist pattern 605 is formed on silicon film 604.

Third, as is shown in FIG. 10B, with a resist pattern 605 being used as a mask, p– areas 606 and 607 with a concentration of about $5 \times 10^{17} cm^{-3}$ are formed by ion implantation of boron, for instance.

P+ area 602 and p– area 606 become a source area 608, while p+ area 603 and p– area 607 become a drain area 609. And the area to which ions were not implanted, because of the masking of resist pattern 605, becomes a channel area 610.

Fourth, after resist pattern 605 is stripped, in a nitrogen atmosphere at the temperature of about 600° C., for instance, by performing an annealing for about four hours (solid phase crystallization method: SPC method), an amorphous silicon film is crystallized. At the same time, the impurities implanted to p+ areas 602 and 603 and p– areas 606 and 607 are activated.

Fifth, in an ECR-CVD method, a gate insulation film 611 comprising a silicon oxidation film is formed on the whole surface.

Sixth, a gate electrode material made from materials such as metal is built up on the surface of gate insulation film 611. By selectively etching the gate electrode material employing a technique such as a light exposure technique, a gate electrode 612 is formed. In forming gate electrode 612 by etching, one side end 613 and the other side end 614 of gate electrode 612 should be made to overlap one side end of p– areas 606 and 607.

Subsequently, following a usual process, as is shown in FIG. 10C, after an interlayer insulation film 615 comprising a silicon oxidation film and a drain electrode are formed. The source electrode is electrically-conductively connected to a high concentration area of a source area (p+ area 602). The drain electrode is electrically-conductively connected to a high concentration drain area of a drain area (p+ area 603). Thus, thin film transistor 500 illustrated in FIG. 9 is fabricated.

Seventh Embodiment

With reference to FIGS. 11A to 11E, one embodiment of a semiconductor device having a CMOS circuit comprising a thin film transistor according to the first to sixth embodiments will be explained below.

Figure 11A:
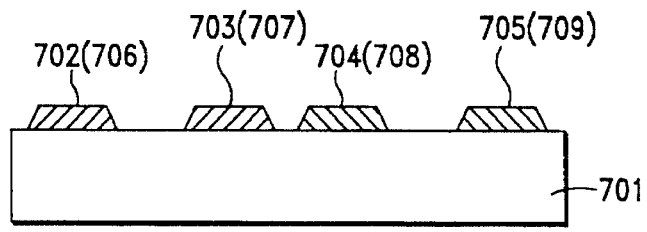
FIGS. 11A to 11E are process sectional views showing a part of a manufacturing method of a CMOS circuit (semiconductor device) using a thin film transistor according to the seventh embodiment of the present invention.
Figure 11B:
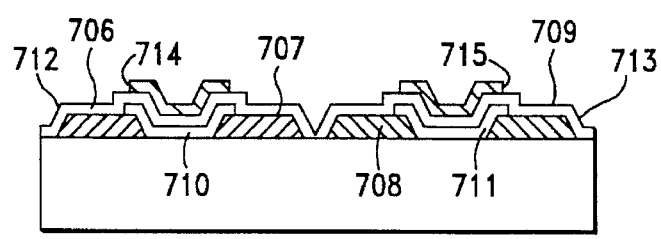
Figure 11C:
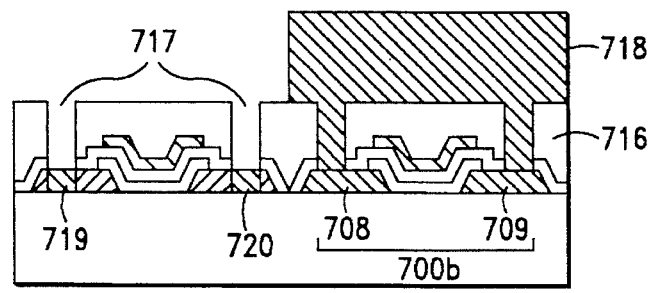
Figure 11D:
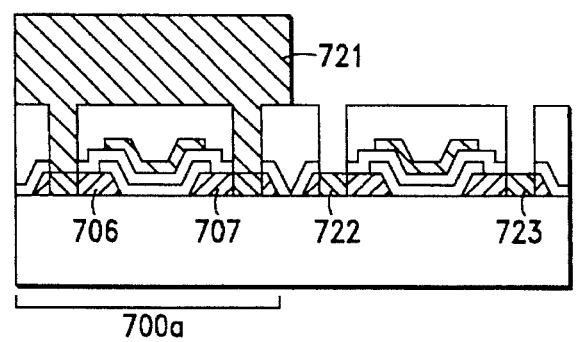
Figure 11E:
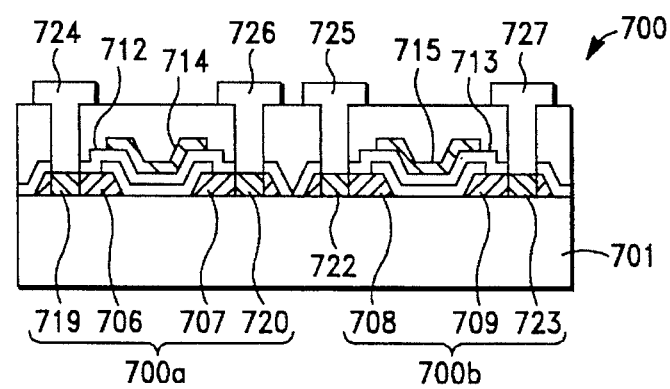

As is shown in FIG. 11E, a CMOS circuit 700 of a semiconductor device in this embodiment has an n-channel type thin film transistor 700a and a p-channel type thin film transistor 700b on the surface of the same insulation substrate 701 made from such materials as glass, quartz and sapphire. In the two thin film transistors, an n– source area 706 and an n– drain area 707 in transistor 700a and a p– source area 708 and a p– drain area 709 (low concentration areas) in transistor 700b overlap ends of gate electrodes 714 and 715, respectively, through gate insulation films 712 and 713, respectively. On the other hand, an n+ source area 719 and a p+ source area 722 and an n+ drain area 720 and a p+ drain area 723 (high concentration areas) are connected to source electrodes 724 and 725 and drain electrodes 726 and 727, respectively.

In order to manufacture a CMOS circuit 700 having such a structure, first, as is shown in FIG. 11A, on the surface of an insulation substrate 701 made from materials such as glass, quartz and sapphire, a silicon thin film with a thickness of about 700Å made from polycrystalline silicon, etc. is formed. Then by selectively etching the thin film, patterns 702, 703, 704, and 705 of the silicon thin film are formed. Afterwards, in a well-known method, about $5 \times 10^{18} cm^{-3}$ phosphorus is ion implanted to patterns 702 and 703 to make the patterns of n– source area 706 and n– drain area 707, respectively. On the other hand, about $5 \times 10^{18} cm^{-3}$ boron is ion implanted to patterns 704 and 705 to make the patterns p– source area 708 and p-drain area 709, respectively.

Then, as is shown in FIG. 11B, channel areas 710 and 711, comprising a silicon thin film with a thickness of about 1000Å made from materials such as polycrystalline silicon, are formed so that n– source area 706 and n– drain area 707, and p– source area 708 and p– drain area 709, are connected respectively. And the whole device is thermally oxidized to form gate insulation films 712 and 713 comprising a silicon oxidation film. This thermal oxidation treatment activates the impurities in n– source area 706, n– drain area 707, p– source area 708 and p– drain area 709 to which ions were implanted. Next, gate electrodes 714 and 715, comprising metal, a transparent electrically-conductive film, polycrystalline silicon to which impurities are added, etc., are formed on gate insulation films 712 and 713, respectively. Ends of gate electrodes 714 and 715 overlaps ends of n– source area 706, n– drain area 707, p– source area 708 and p– drain area 709 through gate insulation films 712 and 713.

As is shown in FIG. 11C, after an interlayer insulation film 716 comprising a silicon oxidation film is formed, contact holes 717 are formed in it. Then, by employing a technique such as a photolithography technique, a resist pattern 718 is formed to cover p– source area 708 and p– drain area 709 of p-channel type thin film transistor 700b. With resist pattern 718 and interlayer insulation film 716 being used as masks, n+ source area 719 and n+ drain area 720 are formed by ion implantation of about $5 \times 10^{21} \text{cm}^{-3}$ of phosphorus.

After resist pattern 718 is removed, as is shown in FIG. 11D, by employing such a technique as a photolithography technique, a resist pattern 721 is formed to cover n– source area 706 and drain area 707 of n-channel type thin film transistor 700a. With resist pattern 721 and interlayer insulation film 716 being used as masks, a p+ source area 722 and a p+ drain area 723 are formed by ion implantation of about $5 \times 10^{21} \text{cm}^{-3}$ of boron.

After resist pattern 721 is removed, the respective impurities which were ion implanted are activated by irradiating a laser beam. After that, as is shown in FIG. 11E, as in a usual process, source electrodes 724 and 725 and drain electrodes 726 and 727, comprising metal, a transparent electrically-conductive film, etc. are connected to n+ source area 719, p+ source area 722, n+ drain area 720 and p+ drain area 723, respectively.

N-channel type thin film transistor 700a and p-channel type thin film transistor 700b formed on the same insulation substrate 701 have improved off current characteristics and on current characteristics.

A structure of an active matrix substrate with peripheral circuits of a liquid crystal display panel built-in as a typical device using a thin film transistor will be explained below as the eighth embodiment of the present invention.

FIG. 12 is a block diagram showing a constitution of an active matrix substrate in this embodiment. As is shown in the figure, an active matrix substrate 800 is divided into a pixel part 800a and peripheral circuit parts 800b and 800c (drive circuit parts). In pixel part 800a, as is shown in FIG. 13, a pixel area 803 is sectioned by scanning lines (gate lines) 801a and 801b (801) connected to peripheral circuit part 800b (scanning line drive circuit), and by a signal line 802 connected to peripheral circuit part 800c (signal line drive circuit). A pixel part 800a has a thin film transistor 800d, which switches from a state in which the side of a signal line 802 and the side of a pixel electrode 804 are connected to another state in which they are disconnected, based on scan signals from scanning line 801a. Thin film transistor 800d must have a small off current. The CMOS circuit of peripheral circuit parts 800b and 800c are composed of thin film transistors of different types of electric conductivity, and the CMOS circuit must have a high operating speed. Accordingly, it is possible to use a thin film transistor according to the present invention in pixel part 800a, and a self-aligned thin film transistor in peripheral circuit parts 800b and 800c.

The constitution is now explained in FIG. 14, a thin film transistor 960a formed in a pixel part of an active matrix substrate of this embodiment and two thin film transistors 900a and 930a formed in peripheral circuit parts are shown in a row. In FIG. 14, shown on the right of the figure is an n-channel type thin film transistor 960a formed in a pixel part; shown in the middle of the figure is an n-channel type thin film transistor 930a formed in peripheral circuit parts; and shown on the left of the figure is a p-channel type thin film transistor 900a formed in peripheral circuit parts. In peripheral circuit parts, the CMOS circuit is composed of p-channel type thin film transistor 900a and n-channel type thin film transistor 930a.

In n-channel type thin film transistor 960a used in the pixel part, as was explained in the first to seventh embodiments, a source area 961a and a drain area 962a are formed in a non-self-aligned way relative to a gate electrode 963a. An end of gate electrode 963a overlaps with an n– source area 964a (low concentration source area) and an n– drain area 965a (low concentration drain area). P-channel type thin film transistors 900a and 930a formed in peripheral circuit parts, on the other hand, have a self-aligned structure. Note that in a liquid crystal display panel, a pixel electrode is electrically-conductively connected to drain area 962a of n-channel type thin film transistor 960a in the pixel part. However, in the following explanation, it is illustrated as a structure in which a usual aluminum electrode is electrically-conductively connected to a drain area, as in source area 961a.

In an active matrix substrate 950a having such a structure, n-channel type thin film transistor 960a has an LDD structure in the pixel part and has a structure in which the density of the trap energy level is reduced. Therefore, its off current is decreased. N-channel type thin film transistor 900a and p-channel type thin film transistor 930a formed in the peripheral circuit parts, on the other hand, have a self-aligned structure with small parasitic capacitance. Therefore, the operating speed in peripheral circuit parts is never sacrificed.

Ninth Embodiment

The constitution of an active matrix substrate with peripheral circuits of a liquid crystal display panel built-in according to the ninth embodiment will be explained below.

An active matrix substrate with peripheral circuits built-in in this embodiment and an active matrix substrate with peripheral circuits built-in in the eighth embodiment have the same basic structure, but they differ in the combination of the thin film transistors used in the pixel area and peripheral circuit parts (drive circuit parts). In this embodiment, the production cost can be lowered by improving the off current characteristics of the thin film transistor used in a pixel part 800a and by decreasing the number of masks used in the manufacturing process of active matrix substrate 800 without sacrificing the operating speed in peripheral circuit parts 800b and 800c.

The structure of the thin film transistor is now explained. FIG. 15 is a sectional view showing the structure of a thin film transistor formed in the pixel part of the active matrix substrate and a thin film transistor formed in the peripheral circuit parts in the liquid crystal display panel illustrated in FIGS. 12 and 13.

In FIG. 15, shown on the right of the figure is an n-channel type thin film transistor 960 formed in the pixel part; shown in the middle of the figure is an n-channel type thin film transistor 930 formed in the peripheral circuit parts; and shown on the left of the figure is a p-channel type thin film transistor 900 formed in the peripheral circuit parts. In the peripheral circuit parts, the CMOS circuit is composed of p-channel type thin film transistor 900 and n-channel type thin film transistor 930.

In n-channel type thin film transistor 960 used in the pixel part and n-channel type thin film transistor 930 formed in the peripheral circuit parts, as was explained in the first to seventh embodiments, source areas 931 and 961 and drain areas 932 and 962 are formed in a non-self-aligned way relative to gate electrodes 933 and 963. The ends of gate electrodes 933 and 963 overlap with n-source areas 934 and 964 (low concentration source areas) and n– drain areas 935 and 965 (low concentration drain areas), respectively. P-channel type thin film transistor 900 formed in the peripheral circuit parts, on the other hand, has a self-aligned structure. Note that in a liquid crystal display panel, a pixel electrode is electrically-conductively connected to drain area 962 of n-channel type thin film transistor 960 in the pixel part. However, in the following explanation, it is illustrated as a structure in which a usual aluminum electrode is electrically-conductively connected to the drain area, as in source area 961.

In an active matrix substrate 950 having such a structure, n-channel type thin film transistor 960 has an LDD structure in the pixel part and has a structure in which the density of the trap energy level is reduced. Therefore, its off current is decreased. N-channel type thin film transistor 930 formed in the peripheral circuit parts, on the other hand, is not self-aligned. Therefore, it has larger parasitic capacitance than a self-aligned structure, and its operating speed may be low. However, either an n-channel type thin film transistor or a p-channel type thin film transistor has a self-aligned structure with small parasitic capacitance. In this embodiment, a p-channel type thin film transistor is self-aligned. Furthermore, even in a non-self-aligned thin film transistor, since source and drain areas overlapping a gate electrode are low concentration areas, the parasitic capacitance can be almost ignored when it is biased in the direction in which a depletion layer extends. Therefore, if a CMOS circuit is formed to have such a structure as in this embodiment, the operating speed is not lower than that in the case in which both the n-channel type thin film transistor and the p-channel type thin film transistor have a self-aligned structure. Accordingly, in this embodiment, since two types of thin film transistors are formed on active matrix substrate 950, productivity can be increased by decreasing the number of masks used in the manufacturing process for the active matrix substrate, compared with active matrix substrate 950a in the eighth embodiment in which three types of thin film transistors are employed.

Tenth Embodiment

FIGS. 16A to 16D are process sectional views showing a part of a manufacturing method for each thin film transistor in a pixel part and peripheral circuit parts when two types of thin film transistors are formed on an active matrix substrate of a liquid crystal display panel, as in the ninth embodiment.

First, as is shown in FIG. 16A, on the surface of an insulation substrate 1001 made from glass, quartz, sapphire, etc., about 500Å of an amorphous silicon film 1002, for instance, is built up. Resist patterns 1003, 1004 and 1005 are formed on silicon film 1002. With these patterns being used as masks, phosphorus is ion implanted to form low concentration areas 1006, 1007 and 1008 containing about $1\times10^{17}cm^{-3}$ of impurities.

Second, amorphous silicon film 1002 is annealed by the irradiation of a laser beam to polycrystallize the film and activate the implanted impurities simultaneously.

Third, as is shown in FIG. 16B, amorphous silicon film 1002 is selectively etched to form silicon thin film patterns 1009, 1010 and 1011. Silicon thin film patterns 1009 and 1010 become active areas of a p-channel type thin film transistor and an n-channel type thin film transistor, respectively, in peripheral circuit parts while silicon thin film pattern 1011 becomes an active area of an n-channel type thin film transistor in a pixel part. And the above-mentioned low concentration areas 1006, 1007 and 1008 become n– source areas 1012 and 1013 (low concentration source areas) and n– drain areas 1014 and 1015 (low concentration drain areas) of an n-channel type thin film transistor. The area in active areas 1010 and 1011 of the n-channel type thin film transistor to which impurities are not implanted becomes channel areas 1016 and 1017.

Fourth, after a gate insulation film 1018 comprising a silicon oxidation film is formed on the whole surface in an ECR-CVD method, respective gate electrodes 1019, 1020 and 1021 made from materials such as metal are formed on the surface. Of gate electrodes 1019, 1020 and 1021, ends of gate electrodes 1020 and 1021 of n-channel type thin film transistors 1023 and 1024 overlap with n– source areas 1012 and 1013 and n– drain areas 1014 and 1015 through gate insulation film 1018. In an extended part 1015a (lower electrode) in drain area 1015 of thin film transistor 1024 used in the pixel part, a storage capacitance is composed of an overlapping gate electrode 1025 in an upper state.

Fifth, as is shown in FIG. 16C, by employing a technique such as a photolithography technique, a resist pattern 1026 is formed to cover n-channel type thin film transistors 1023 and 1024. Boron is ion implanted. In this ion implantation, a gate electrode 1019 is used as a mask, and a source area 1027 and a drain area 1028 having impurity concentration of about $5\times10^{21}cm^{-3}$ are formed by self-alignment in a thin film transistor 1022.

Sixth, after resist pattern 1026 is removed, impurities are activated by irradiating a laser beam. The irradiation of a laser beam is performed to activate impurities to lower their resistance, not to restore the crystalline state disturbed by the implanted impurities. A p-channel type thin film transistor 1022 used in the peripheral circuit parts need not have a small off current. Accordingly, in this process, it is sufficient to lower the resistance of the impurities by activating them by the irradiation of a laser beam. The restoration of the crystalline state is not required.

Seventh, as is shown in FIG. 16D, an interlayer insulation film 1029 is formed. By making use of contact holes in insulation film 1029, a source electrode 1031 and a drain electrode 1032 are electrically-conductively connected to respective thin film transistors 1022, 1023 and 1024.

As is clear from the above explanation, in the manufacturing method for an active matrix substrate in this embodiment, with respect to the mask patterns used in the implantation of impurities, two mask patterns 1003 and 1026 are employed. By contrast, if both an n-channel type thin film transistor and a p-channel type thin film transistor in the peripheral circuit parts have a self-aligned structure, and a thin film transistor in the pixel part has a structure according to the present invention, three masks will be necessary. The operating speed of the circuit, as was explained in the ninth embodiment, is almost the same as in the eighth and ninth embodiments. Hence, the production cost can be reduced by decreasing the number of masks without sacrificing the operating speed, etc.

Note that in this embodiment, the thin film transistor used in the pixel part is an n-channel type, but it may be a p-channel type.

Figure 17A:
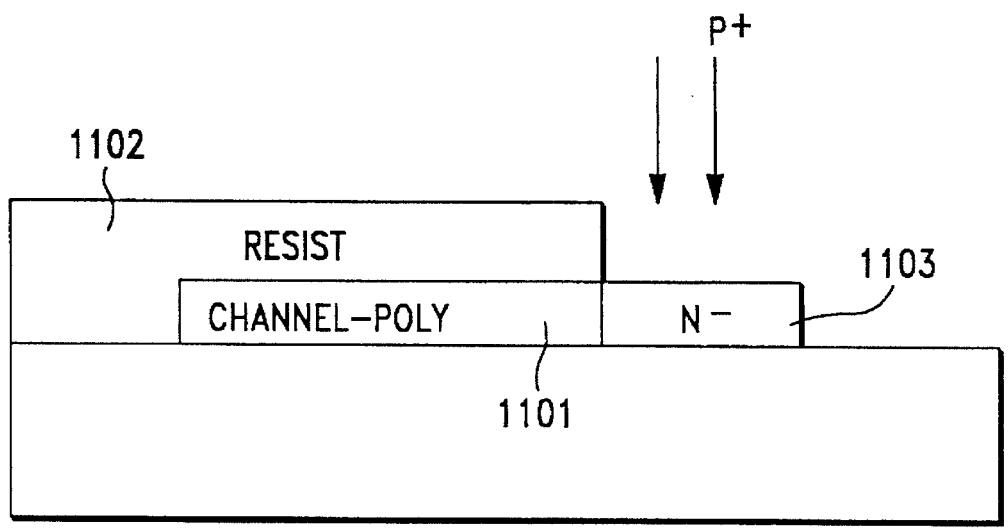
FIGS. 17A and 17B are process sectional views showing a part of a method of manufacturing a storage capacitor in a pixel part in a conventional liquid crystal display panel.
Figure 17B:
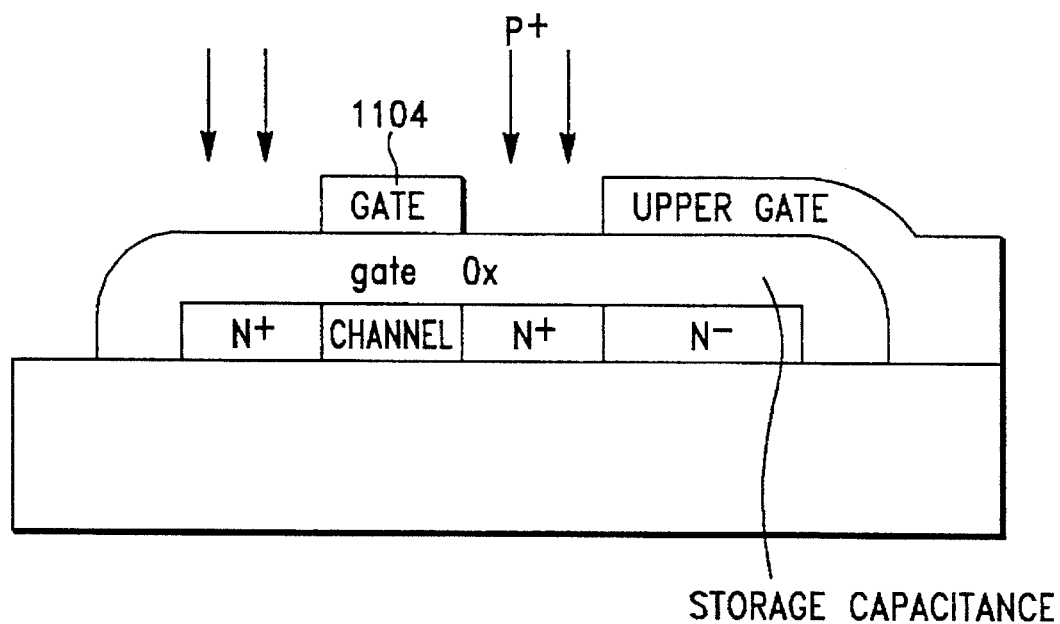

In a liquid crystal display panel, as is shown in FIG. 13, to form storage capacitance 805 in the pixel part, there is a tendency that a structure in which an extended part is formed on the side of a drain area and scanning lines in an upper state overlap the extended part is used. In order to form a storage capacitance having this structure, in a conventional manufacturing method as a comparative example, as is shown in FIGS. 17A and 17B, after a resist mask 1102 is formed by opening a hole at an end of a polycrystalline silicon film 1101, ions are implanted to make an extended part 1103, a low concentration area. Then, with a gate electrode 1104 being used as a mask, impurities of high concentration are ion implanted. According to the manufacturing method in this embodiment, as is shown in FIGS. 16A and 16B, in the process in which impurities of low concentration are implanted, an extended part 1015a becomes a low concentration area automatically. In the subsequent processes, as is shown in FIG. 16B, when gate electrodes 1019, 1020 and 1021 are formed, a scanning line 1025 in an upper state is formed simultaneously and is made to overlap extended part 1015a. Accordingly, it is possible to make a storage capacitance in the process of manufacturing thin film transistor 1024 in the pixel part without adding other processes.

Eleventh Embodiment

FIGS. 18A to 18E are process sectional views showing a part of a manufacturing method for an active matrix substrate with peripheral circuits of a liquid crystal display panel built-in. The CMOS circuit in a drive part is composed of an n-channel type thin film transistor having a non-self-aligned structure and a p-channel type thin film transistor having a self-aligned structure with small parasitic capacitance and can operate at a high speed. An n-channel type thin film transistor in a pixel part has a non-self-aligned structure.

In the figures, n-channel type thin film transistors 1300a and 1300c have a source area and a drain area comprising silicon films of different thickness. Gate electrodes 1317 and 1318 overlap a part of n− source areas 1310 and 1311 and n− drain areas 1312 and 1313, which are thin and have impurity concentration of under $1\times10^{19}\text{cm}^{-3}$ through a gate insulation film 1316. In a p-channel type thin film transistor 1300b, on the other hand, a p+ source area 1323 and a p+ drain area 1324 are formed and are self-aligned relative to a gate electrode 1319.

The area comprising thick silicon films in the source area and drain area of n-channel type thin film transistors 1300a and 1300c is n+ source areas 1302 and 1303 and n+ drain areas 1304 and 1305 of high impurity concentration. Therefore, lowering of the on current due to parasitic resistance is prevented.

Figure 18A:
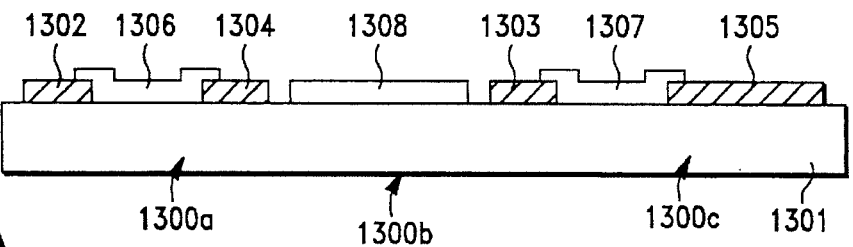
FIGS. 18A to 18E are process sectional views showing a part of a manufacturing method for a thin film transistor formed on an active matrix substrate of a liquid crystal display panel according to the eleventh embodiment of the present invention.

In order to manufacture an active matrix substrate having such a structure, first, as is shown in FIG. 18A, on an insulation substrate 1301 made from glass, quartz, sapphire, etc., n+ source areas 1302 and 1303 and n+ drain areas 1304 and 1305, comprising n+ silicon thin films such as polycrystalline silicon with a thickness of about 2000Å to which about $5\times10^{21}\text{cm}^{-3}$ of phosphorus is added, are formed. Silicon patterns 1306 and 1307 with a thickness of about 500Å are formed on the surface to connect source area 1302 and drain area 1304, source area 1303 and drain area 1305, respectively. At the same time, a silicon pattern 1308 is formed to form a p-channel type thin film transistor 1300b.

Figure 18B:
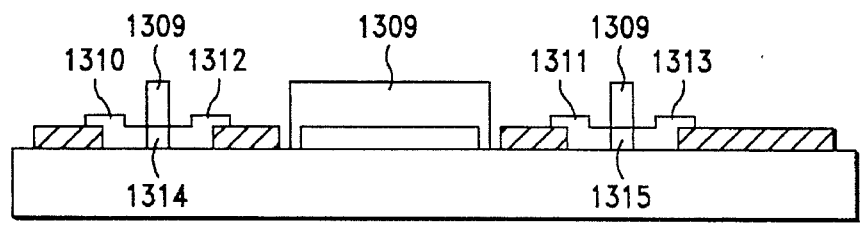

Then, as is shown in FIG. 18B, a resist pattern 1309 is formed by employing a photolithography technique. With 1309 being used as a mask, an ion implantation is performed to make a part of silicon thin film patterns 1306 and 1307 to have a concentration of about $5\times10^{18}\text{cm}^{-3}$. The areas become n− source areas 1310 and 1311 and drain areas 1312 and 1313 of a thin film transistor of so-called GOLDD type (gate overlap LDD type). The areas in silicon patterns 1306 and 1307 to which ions were not implanted become channel areas 1314 and 1315.

After resist pattern 1309 is stripped, by irradiation of a laser beam on the whole surface, the implanted impurities are activated and the crystalline grains in channel areas 1314 and 1315 are enlarged at the same time to improve the characteristics of the transistor.

Figure 18C:
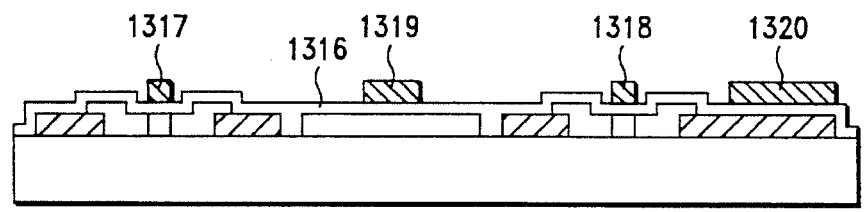

Then, as is shown in FIG. 18C, a gate oxidation film 1316 comprising an insulation film such as a silicon oxidation film is formed on the whole surface. On the surface of film 1316, gate electrodes 1317, 1318 and 1319, made from metal, a transparent electrically-conductive film, polycrystalline silicon film to which impurities are added, etc., are formed. Gate electrodes 1317 and 1318 overlap a part of n− source areas 1310 and 1311 and drain areas 1312 and 1313 through gate insulation film 1316. And a part of an n+ drain area 1305 of the thin film transistor used in the pixel part overlaps a gate electrode 1320 in a prior stage through gate insulation film 1316 to form a storage capacitance.

Figure 18D:
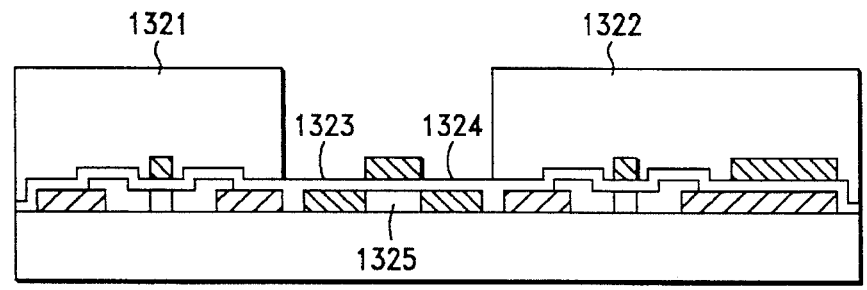

Next, as is shown in FIG. 18D, by employing a photolithography technique, resist patterns 1321 and 1322 are formed to cover an n-channel type thin film transistor 1300a and an n-channel type thin film transistor 1300c in the pixel part. With the resist patterns being used as masks, boron is ion implanted to form a p+ source area 1323 and a p+ drain area 1324 having a concentration of about $5\times10^{21}\text{cm}^{-3}$. The area to which ions were not implanted becomes a channel area 1325.

Figure 18E:
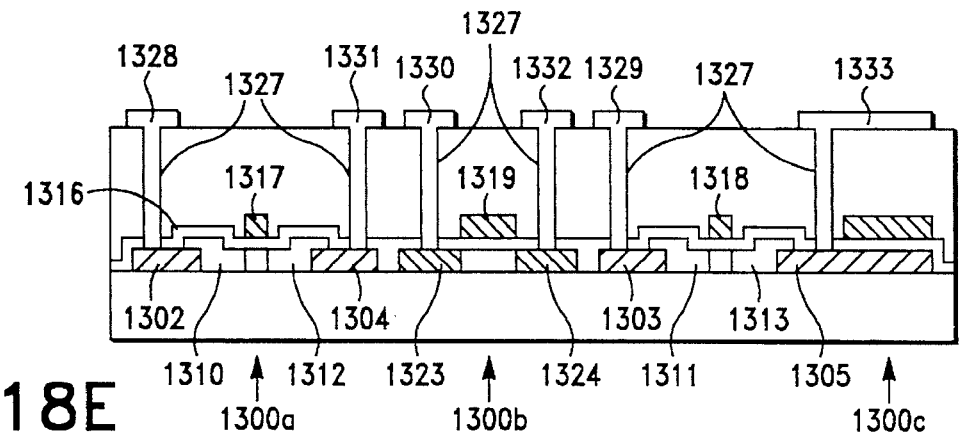

After resist patterns 1321 and 1322 are removed, impurities are activated by irradiation of a laser beam. After that, as in a usual process, as is shown in FIG. 18E, after an interlayer insulation film 1326 comprising a silicon oxidation film is formed, contact holes 1327 are made in it. Through these contact holes 1327, source electrodes 1328, 1329 and 1330 are connected to an n+ source area 1302, an n+ source area 1303 and a p+ source area 1323, while drain electrodes 1331 and 1332 are connected to an n+ drain area 1304 and a p+ drain area 1324. And the pixel electrode 1333 is connected to an n+ drain area 1305 of the thin film transistor in the pixel part.

As was explained above, in this embodiment, since n− source area 1311 and n− drain area 1313 are activated before gate electrodes 1317 and 1318 are formed, the material of gate electrode 1318 can be selected without being restricted by the activation condition. Therefore, gate electrode 1318 can be made from metal.

Since n-channel type thin film transistor 1300c with a small off current in the pixel part has the same structure as that of n-channel type thin film transistor 1300a in the peripheral circuit parts, its manufacturing process can be simplified. In this case, too, since p-channel type thin film transistor 1300b for a CMOS circuit in the peripheral circuit parts has a self-aligned structure, the operating speed is not sacrificed. And since there is no need to consider the off current characteristics, p-channel type thin film transistor 1300b can be composed of a source area and a drain area of high concentration in one silicon pattern in order to minimize the number of processes.

Twelfth Embodiment

In this embodiment, an n-channel type thin film transistor is used in a pixel part of a liquid crystal display with peripheral circuits built-in. A CMOS circuit is composed of self-aligned thin film transistors with small parasitic capacitance which can operate at a high speed. This embodiment is a variation of the eighth embodiment in which three types of thin film transistors are employed.

Figure 19A:
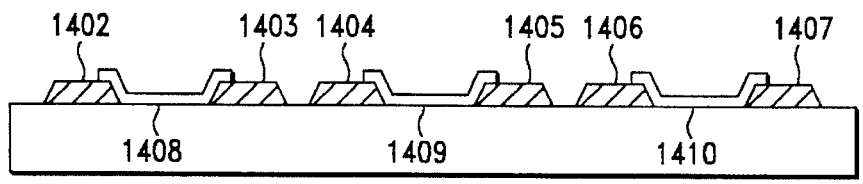
FIGS. 19A to 19E are process sectional views showing a part of a manufacturing method for a thin film transistor formed on an active matrix substrate of a liquid crystal display panel according to the twelfth embodiment of the present invention.
Figure 19B:
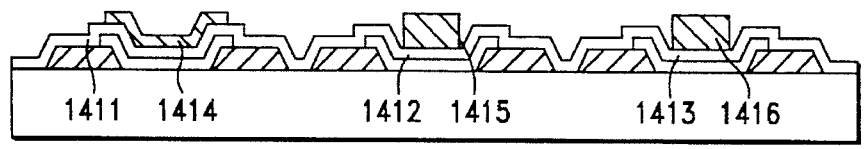
Figure 19C:
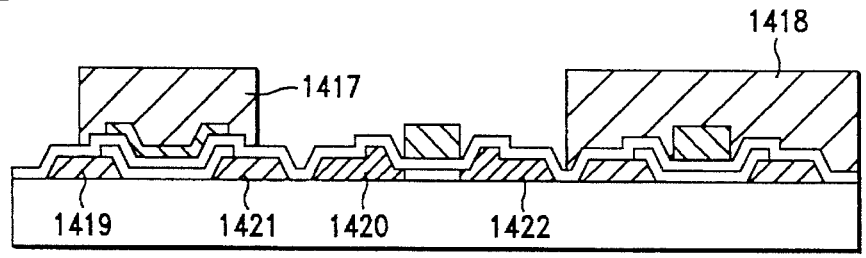
Figure 19D:
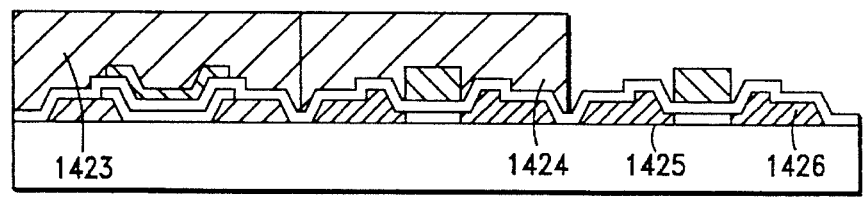
Figure 19E:
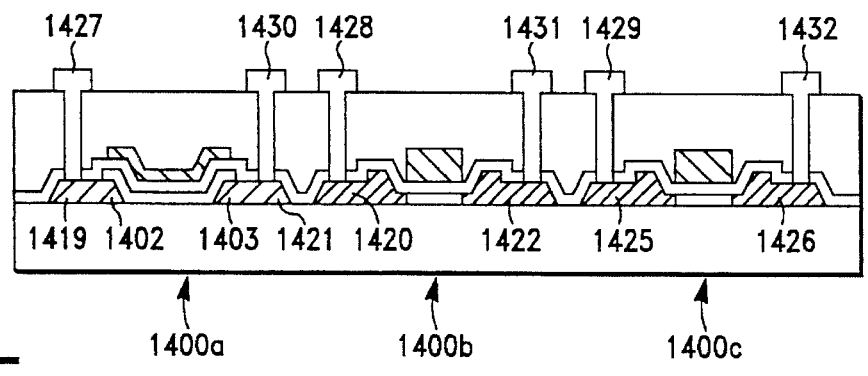
Figure 22A:
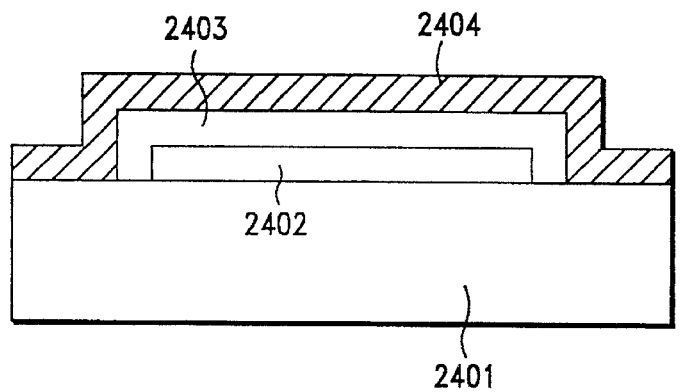
FIGS. 22A to 22D are sectional views showing a manufacturing method for another conventional thin film transistor.
Figure 22B:
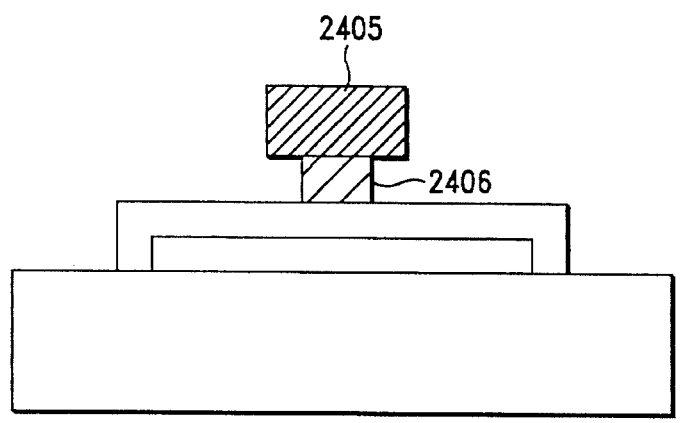
Figure 22C:
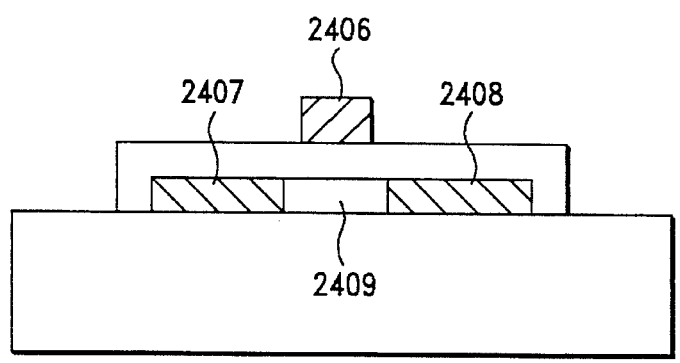
Figure 22D:
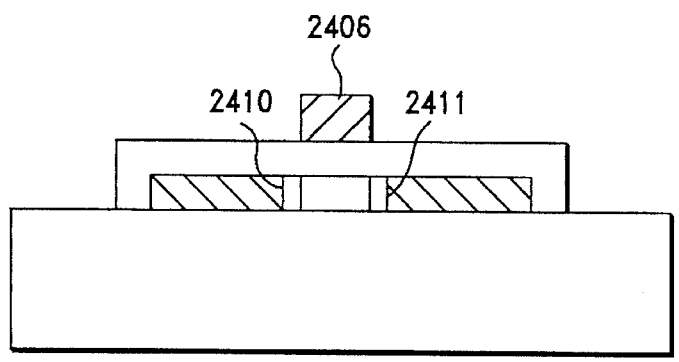

FIGS. 19A to 19E are process sectional views. As is shown in FIG. 19E, in an active matrix substrate in this embodiment, on a common insulation substrate 1401, in a pixel part, there is an n-channel type thin film transistor 1400a having a so-called GOLDD structure. In peripheral circuit parts, there is a CMOS circuit composed of an n-channel type thin film transistor 1400b and a p-channel type thin film transistor 1400c having a self-aligned structure.

In order to manufacture these thin film transistors, first, as is shown in FIG. 19A, a polycrystalline silicon thin film having a thickness of about 1000Å, for instance, is built up on the surface of an insulation substrate 1401 made from materials such as glass. Silicon thin film patterns 1402, 1403, 1404, 1405, 1406 and 1407 are formed by selectively etching the silicon thin film. Then, phosphorus is ion implanted to the whole surface so that the silicon thin film patterns 1402, 1403, 1404, 1405, 1406 and 1407 have a concentration of about $5\times10^{18}cm^{-3}$.

Then channel areas 1408, 1409 and 1410 comprising a silicon thin film such as a polycrystalline silicon film with a thickness of about 1000Å are formed in such a way so as to connect silicon thin film patterns 1402 and 1403, patterns 1404 and 1405, and patterns 1406 and 1407, respectively.

As is shown in FIG. 19B, the whole surface is thermally oxidated to form gate insulation films 1411, 1412 and 1413 in a silicon oxidation film. This thermal treatment process also activates the implanted ions. Next, gate electrodes 1414, 1415 and 1416 comprising metal, a transparent electrically-conductive film, a polycrystalline silicon film to which impurities are added, etc., are formed in the predetermined areas on the surface of gate insulation films 1411, 1412 and 1413. A gate electrode 1414 overlaps a part of n– silicon thin film patterns 1402 and 1403 through a gate insulation film 1411. Gate electrodes 1415 and 1416, on the other hand, do not overlap n– silicon thin film patterns 1404 and 1405, respectively.

As is shown in FIG. 19C, by employing a photolithography technique, resist patterns 1417 and 1418 are formed to cover at least ends of gate electrodes of a p-channel type thin film transistor and an n-channel type thin film transistor in the pixel part. With the resist patterns being used as masks, phosphorus is ion implanted to form n+ source areas 1419 and 1420 and n+ drain areas 1421 and 1422.

After resist patterns 1417 and 1418 are removed, as is shown in FIG. 19D, by employing a photolithography technique and others, resist patterns 1423 and 1424 are formed to cover an n-channel type transistor and an n-channel type transistor in the pixel part. With these patterns being used as masks, boron is ion implanted to form a p+ source area 1425 and a p+ drain area 1426 having a concentration of about $5\times10^{21}cm^{-3}$.

After resist patterns 1417 and 1418 are removed, as is shown in FIG. 19E, the impurities are activated by irradiation of a laser beam. After that, as in a usual process, source electrodes 1427, 1428 and 1429 and drain electrodes 1430, 1431 and 1432 comprising metal, a transparent electrically-conductive film, etc., are 1421 and 1422, and a p+ drain area 1426, respectively. N-channel type thin film transistor 1400a having the so-called GOLDD structure is formed in the pixel part, while n-channel type and p-channel type thin film transistors 1400b and 1400c having a self-aligned structure are formed in the peripheral circuit parts.

As is clear from the above explanation, according to the present invention, the areas in a source area and a drain area overlapping ends of a gate electrode through a gate insulation film are low concentration areas formed in a process prior to that in which the gate electrode is formed. Therefore, according to the present invention, when the impurities implanted to the source area and drain area are activated, the gate electrode has not yet been formed. Accordingly, since the impurities can be activated without being restricted by the heat resistance of the materials of the gate electrode, and the disturbance of the crystalline state caused by the implantation of impurities can be restored sufficiently, the density of the trap energy level in the drain area and its neighborhood can be reduced. And since the drain area overlaps the gate electrode in a low concentration area, the field strength in that area is small. Hence, improved off current characteristics of the thin film transistor are obtained.

If the low concentration area is where the crystallization of the silicon film is performed after the implantation of impurities to the silicon film, then in addition to the increase of productivity owing to the decrease of the number of processes, there is a further improvement of the off current characteristics because the crystalline state is not disturbed by the implantation of impurities after the crystallization treatment.

When the thickness of the films in the low concentration area is equal to that of the films in the channel area, the surface is flattened and an electric field does not concentrate locally, hence the off current characteristics are improved. If the films in the low concentration area are thinner than a depletion layer determined by the impurity concentration, the depletion layer reaches the lower surface of the low concentration area, and the capacitance areas connected in series increase, therefore the parasitic capacitance decreases. If an area with a thick film which connects to a low concentration area or a high concentration area is set up in a source area and a drain area, since the areas reduce the parasitic resistance, the operating speed is not sacrificed.

In a liquid crystal display panel with the thin film transistor (n-channel type thin film transistor) built-in in a pixel part, if the same n-channel type thin film transistor is employed in a CMOS circuit in a drive circuit part and if a p-channel type thin film transistor to constitute the CMOS circuit with the n-channel type thin film transistor has a self-aligned structure, the processes can be simplified and a high speed operation of the drive circuit can be realized by making full use of each process. Because the thin film transistor having a self-aligned structure is in the drive circuit part, the off current characteristics are not strictly controlled. Thus, the number of processes can be minimized by forming the transistor as an integral high concentration area.

Furthermore, if an extended area is formed in a drain area of a liquid crystal display panel at the same time with a low concentration area, etc., to form a storage capacitance between it and a gate line in an upper state, a storage capacitance can be made by making use of other processes.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

I claim:

1. A method for manufacturing a thin film transistor on a substrate, comprising the steps of:

forming a thin silicon film on the substrate;

forming a source area, a drain area and a channel area in the silicon film by implanting impurities of a predetermined type to selected portions of the silicon film where the source and drain areas are to be formed, the channel area being formed between the source area and the drain area;.

forming a gate insulation film on the channel area and at least a portion of the source and drain areas;

after forming the source and drain areas, forming a gate electrode having a first end and a second end on the gate insulation film over the channel area such that the first end overlaps one end of the source area and the second end overlaps one end of the drain area;

forming an interlayer insulation film over the gate electrode and the gate insulation film;

forming two contact holes in the interlayer insulation film and the gate insulation film to expose a portion of the source and drain area, respectively;

implanting impurities of the predetermined type to the exposed portion of the source and drain area to form a high impurity concentration area in the source and drain areas, respectively; and forming a source electrode and a drain electrode in the respective contact holes to connect to the respective high impurity concentration areas.

2. The method of claim 1, further comprising, after the step of forming the source, drain and channel areas, the step of performing a crystalline treatment on the silicon film.

3. A method for manufacturing a thin film transistor on a substrate, comprising the steps of:

forming a first thin silicon film containing a low concentration of impurities of a predetermined type on the substrate;

selectively etching the first thin silicon film so as to form a source area and a drain area in the first thin silicon film;

forming a second thin silicon film on the substrate as a channel area to connect between the source and drain areas;

forming a gate insulation film on the channel area and at least a portion of the source and drain areas;

forming a gate electrode having a first end and a second end on the gate insulation film over the channel area such that the first end substantially overlaps one end of the source area and the second end substantially overlaps one end of the drain area;

forming a mask coveting the gate electrode and a predetermined area of the source and drain areas; and implanting impurities of the predetermined type to the source and drain areas such that the areas of the source and drain area uncovered by the mask become high impurity concentration areas.

4. The method of claim 3 wherein the second thin film is formed so as to partially overlap the source and drain areas.

5. The method of claim 3, further comprising the steps of:

forming an interlayer insulation film over the gate electrode and the gate insulation film;

forming two contact holes in the interlayer insulation film and the gate insulation film to expose a portion of the predetermined area of the source and drain areas, respectively; and forming a source electrode and a drain electrode in the respective contact holes to connect to the predetermined area of the source and drain areas, respectively.

6. A method for manufacturing a thin film transistor on a substrate, comprising the steps of:

forming a first thin silicon film containing a high concentration of impurities of a predetermined type on the substrate;

selectively etching the first thin silicon film so as to form a first area and a second area in the first thin silicon film as high impurity concentration areas;

forming a second thin silicon film connecting between the first and second areas on the substrate, the second silicon film including a third area, a fourth area and a fifth area connecting between the third and fourth areas;

implanting a low concentration of impurities of the predetermined type to the third and fourth areas in the second thin silicon film so that the first and third areas form a source area, the second and fourth areas form a drain area and the fifth area forms a channel area connecting between the source and drain areas;

forming a gate insulation film on the channel area and at least a portion of the source and drain areas; and forming a gate electrode having a first end and a second end on the gate insulation film over the channel area such that the first end overlaps one end of the source area and the second end overlaps one end of the drain area.

7. The method of claim 6, further comprising, after the step of implanting a low concentration of impurities, the step of performing a crystalline treatment on the first and second than silicon films.

8. The method of claim 6 wherein the second thin silicon film is formed so as to partially overlap the first and second areas.

9. A method for manufacturing a CMOS circuit including two thin film transistors of two different types on a substrate, comprising the steps of;

forming a first thin silicon film on the substrate;

selectively etching the first thin silicon film to form first, second, third and fourth areas in the first thin silicon film;

implanting a low concentration of impurities of a first conductivity type to the first and second areas to form source and drain areas, respectively, of a first thin film transistor;

implanting a low concentration of impurities of a second conductivity type opposite to the first conductivity type to the third and fourth areas to form source and drain areas, respectively, of a second thin film transistor;

forming a second thin silicon film on the substrate as a channel area of the first transistor connecting between the source and drain areas of the first transistor as well as a third thin silicon film on the substrate as a channel area of the second transistor connecting between the source and drain areas of the second transistor;

forming a gate insulation film on the source, drain and channel areas of the two thin film transistors; and forming two gate electrodes over the two channel areas, respectively, each gate electrode having a first end and a second end with the first end overlapping one end of the respective source area and the second end overlapping one end of the respective drain area.

10. The method of claim 9, further comprising the steps of:

forming an interlayer insulation film over the two gate electrodes and the gate insulation film;

forming four contact holes in the interlayer insulation film and the gate insulation film to expose a portion of the two source areas and the two drain areas, respectively;

implanting impurities of the first conductivity type to the exposed portion of the source and drain areas of the first transistor to form a high impurity concentration area therein, respectively;

implanting impurities of the second conductivity type to the exposed portion of the source and drain areas of the second transistor to form a high impurity concentration area therein, respectively; and forming two source electrodes and two drain electrodes in the respective contact holes to connect to the respective high impurity concentration areas.

11. The method of claim 9 wherein the second thin silicon film is formed so as to partially overlap the source and drain areas of the first transistor, and the third thin silicon film is formed so a to partially overlap the source and drain areas of the second transistor.

12. A method for manufacturing a liquid crystal display (LCD) circuit including three thin film transistors on a substrate, comprising the steps of:

forming a thin silicon film including first, second and third regions on the substrate;

implanting impurities of a first conductivity type to the selected portions of the first and second regions where respective source and drain areas of first and second transistors are to be formed;

selectively etching the silicon film so as to form a source area, a drain area and a channel area in each of the first and second regions for the first and second transistors respectively with the respective channel area being formed between the respective source and the drain areas and to form a pattern in the third region;

forming a gate insulation film on the three regions;

forming first, second and third gate electrodes on the first, second and third regions, respectively, each of the first and second gate electrodes being formed on the respective channel area and having a first end and a second end with the first end overlapping one end of the respective source area and the second end overlapping one end of the respective drain area; and implanting impurities of a second conductivity type opposite to the first conductivity type to the pattern in the third region with the third gate electrode being used as a mask to form source, drain and channel areas for a third transistor with the channel area of the third transistor being formed under the third gate electrode;

wherein the step of forming the three gate electrodes includes forming a fourth gate electrode on the gate insulating film over the drain area of the second transistor and wherein the drain area of the second transistor includes an extended part which forms a storage capacitance with the fourth gate electrode.

13. The method of claim 12 wherein the first and third transistors are formed as CMOS transistors.

14. The method of claim 12 wherein the source and drain areas of the first and second transistors are formed as low impurity concentration areas.

15. A method for manufacturing a liquid crystal display (LCD) circuit including first, second and third thin film transistors on first, second and third regions of a substrate, respectively, the method comprising the steps of;

forming a thin silicon film containing a high concentration of impurities of a first conductivity type on the substrate;

selectively etching the thin silicon film to form first and second areas on the first region and third and fourth areas on the second region;

forming a first silicon pattern on the first region connecting between the first and second areas, a second silicon pattern on the second region connecting between the third and fourth areas, and a third silicon pattern on the third region, the first and second silicon patterns each including a first portion, a second portion and a third portion connecting between the first and second portions;

implanting a low concentration of impurities of the first conductivity type to the first and second portions of the first and second patterns respectively, so that the first area and the first portion of the first silicon pattern form a source area of a first transistor and the second area and the second portion of the first silicon pattern form a drain area of the first transistor, the third area and the first portion of the second silicon pattern form a source area of a second transistor and the fourth area and the second portion of the second silicon pattern form a drain area of the second transistor, and the third portion of each of the first and second silicon patterns forms a channel area of the respective transistors;

forming a gate insulation film on the three regions of the substrate;

forming first, second and third gate electrodes on the first, second and third regions, respectively, each of the first and second gate electrodes being formed over the respective channel area and having a first end and a second end with the first end overlapping one end of the respective source area and the second end overlapping one end of the respective drain area; and implanting a high concentration of impurities of a second conductivity type opposite to the first conductivity type to the third silicon pattern with the third gate electrode being used as a mask to form source and drain areas of a third thin film transistor and a channel area between the source and drain areas of the third transistor.

16. The method of claim 15, further comprising, after the step of forming the gate insulation film, the step of activating the implanted impurities.

17. The method of claim 15, wherein the step of forming the three gate electrodes includes forming a fourth gate electrode on the gate insulation film over the drain area of the second transistor and wherein the fourth area in the drain area of the second transistor includes an extended part which forms a storage capacitance with the fourth gate electrode.

18. The method of claim 15 wherein the first silicon pattern is formed so as to partially overlap the first and second areas, and the second silicon pattern is formed so as to partially overlap the third and fourth areas.

19. A method for manufacturing a liquid crystal display (LCD) circuit including first, second and third thin film transistors on first, second and third regions of a substrate, respectively, the method comprising the steps of:

forming a thin silicon film on the substrate;

selectively etching the thin silicon film to form first and second areas on the rest region, third and fourth areas on the second region, and fifth and sixth areas on the third region, the first and second areas each including a first part and a second part;

implanting impurities of a first conductivity type to the six areas;

forming first, second and third channel areas on the substrate connecting between the first and second areas, the third and fourth areas, and the fifth and six areas, respectively;

forming a gate insulation film on the three regions of the substrate;

forming first, second and third gate electrodes on the gate insulation film over the first, second and third channel areas, respectively, the first gate electrode overlapping the first parts of the first and second areas on the first region;

implanting a high concentration of impurities of the first conductivity type to the second part of the first and second areas and the third and fourth areas with the second gate electrode being used as a mask, so that source areas and drain areas of the first and second transistors are formed, respectively; and implanting a high concentration of impurities of a second conductivity type opposite to the first conductivity type to the fifth and sixth areas using the third gate electrode as a mask to form a source area and a drain area of the third transistor.

20. The method of claim 19 wherein the first channel area is formed so as to partially overlap the first and second areas, the second channel areas is formed so as to partially overlap the third and fourth area, and the third channel area is formed so as to partially overlap the fifth and sixth areas.

* * * * *